United States Patent
Nitayama et al.

[11] Patent Number: 5,258,635
[45] Date of Patent: Nov. 2, 1993

[54] MOS-TYPE SEMICONDUCTOR INTEGRATED CIRCUIT DEVICE

[75] Inventors: Akihiro Nitayama; Hiroshi Takato; Fumio Horiguchi; Fujio Masuoka, all of Tokyo, Japan

[73] Assignee: Kabushiki Kaisha Toshiba, Kawasaki, Japan

[21] Appl. No.: 754,191

[22] Filed: Aug. 28, 1991

Related U.S. Application Data

[63] Continuation of Ser. No. 448,153, Dec. 8, 1989, abandoned, which is a continuation-in-part of Ser. No. 443,229, Sep. 5, 1989, abandoned.

[30] Foreign Application Priority Data

| Sep. 6, 1988 | [JP] | Japan | 63-223008 |
| Dec. 9, 1988 | [JP] | Japan | 63-311292 |
| Jan. 17, 1989 | [JP] | Japan | 1-8008 |

[51] Int. Cl.$^5$ .............................. H01L 29/26
[52] U.S. Cl. ........................ 257/329; 257/330; 257/343; 257/369
[58] Field of Search ............. 357/23.3, 23.4, 22 D, 357/55, 23.6, 42, 51; 257/329, 330, 343, 369

[56] References Cited

U.S. PATENT DOCUMENTS

| 4,568,958 | 2/1986 | Baliga | 357/23.4 |
| 4,630,088 | 12/1986 | Ogura et al. | 357/23.6 |
| 4,651,184 | 3/1987 | Malhi | 357/23.4 |
| 4,670,768 | 6/1987 | Sunami et al. | 357/42 |
| 4,672,410 | 6/1987 | Miura et al. | 357/23.6 |
| 4,829,358 | 5/1989 | Tamazaki | 357/41 |
| 4,851,889 | 7/1989 | Matsuzaki | 357/23.4 |
| 4,920,397 | 4/1990 | Ishijima | 357/23.4 |
| 4,941,030 | 7/1990 | Majumdar | 357/23.4 |

OTHER PUBLICATIONS

Sze, "Semiconductor Device", pp. 479 and 493, 1985.

Primary Examiner—Andrew J. James
Assistant Examiner—Hung Xuan Dang
Attorney, Agent, or Firm—Oblon, Spivak, McClelland, Maier & Neustadt

[57] ABSTRACT

A MOS-type semiconductor integrated circuit device is provided in which MOS transistors are formed in a vertical configuration. The MOS transistors are constituted by pillar layers formed on the substrate. The outer circumferential surfaces of the pillar layers are utilized to form the gates of the MOS transistors. Thus, large gate widths thereof can be obtained within a small area. As a result, the total chip area of the MOS transistors can be significantly reduced while maintaining a prescribed current-carrying capacity.

14 Claims, 37 Drawing Sheets

P-ch
W=12μm
L=0.5μm n-ch
W=6μm
L=0.5μm

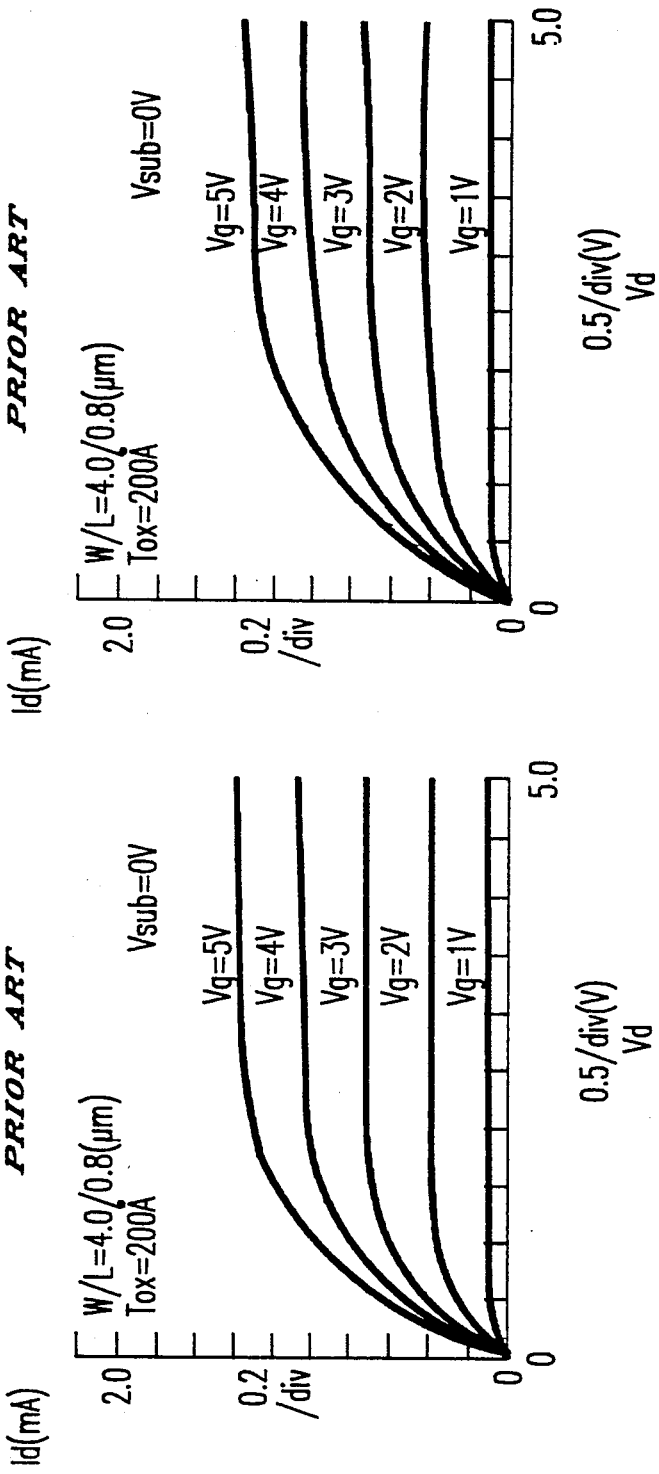
FIG. 8b PRIOR ART
FIG. 8a PRIOR ART
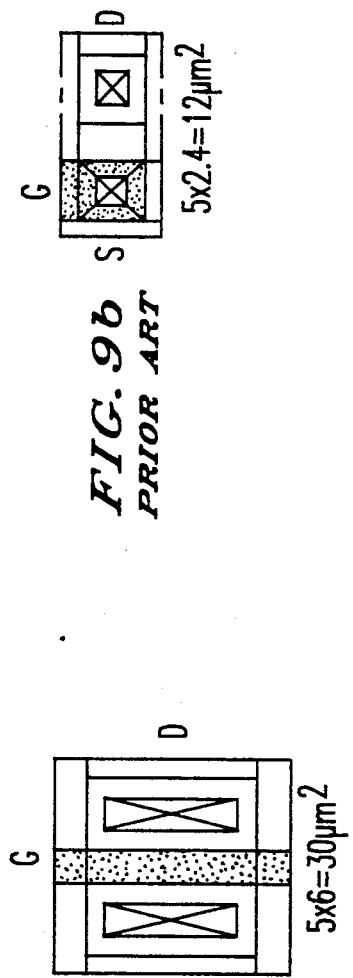
FIG. 9b PRIOR ART
FIG. 9a PRIOR ART

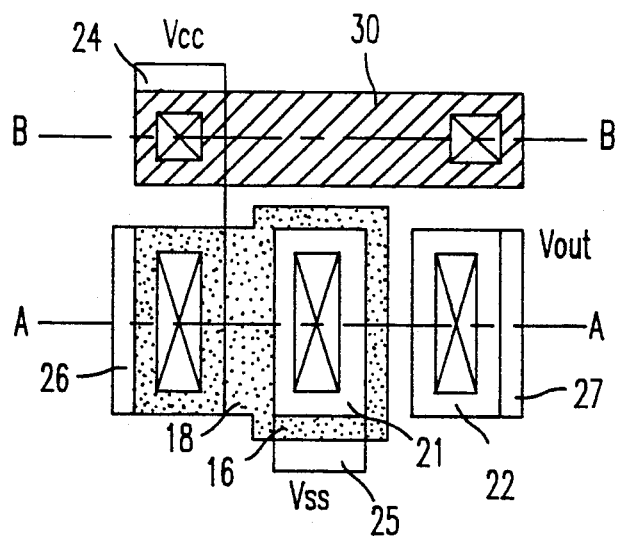
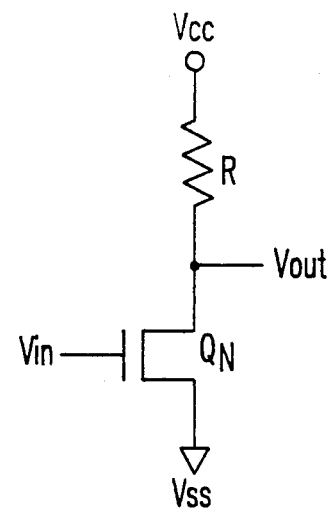
FIG. 11a          FIG. 11b
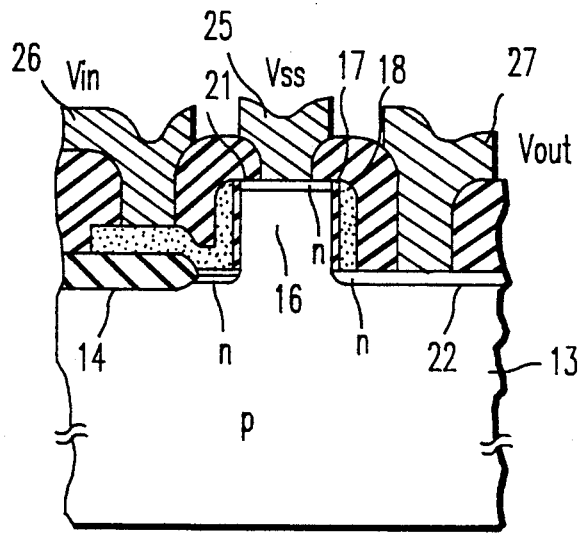
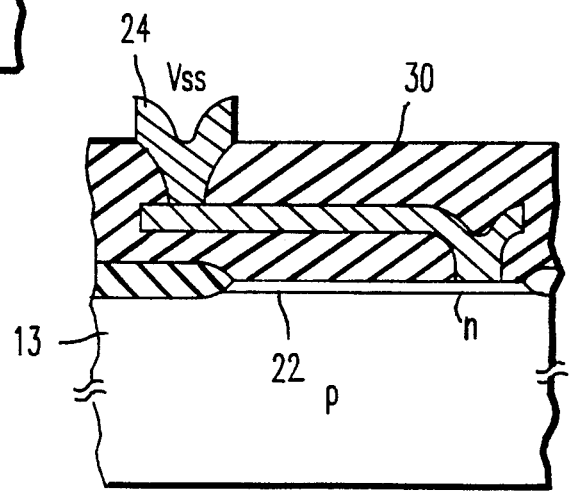
FIG. 12a          FIG. 12b

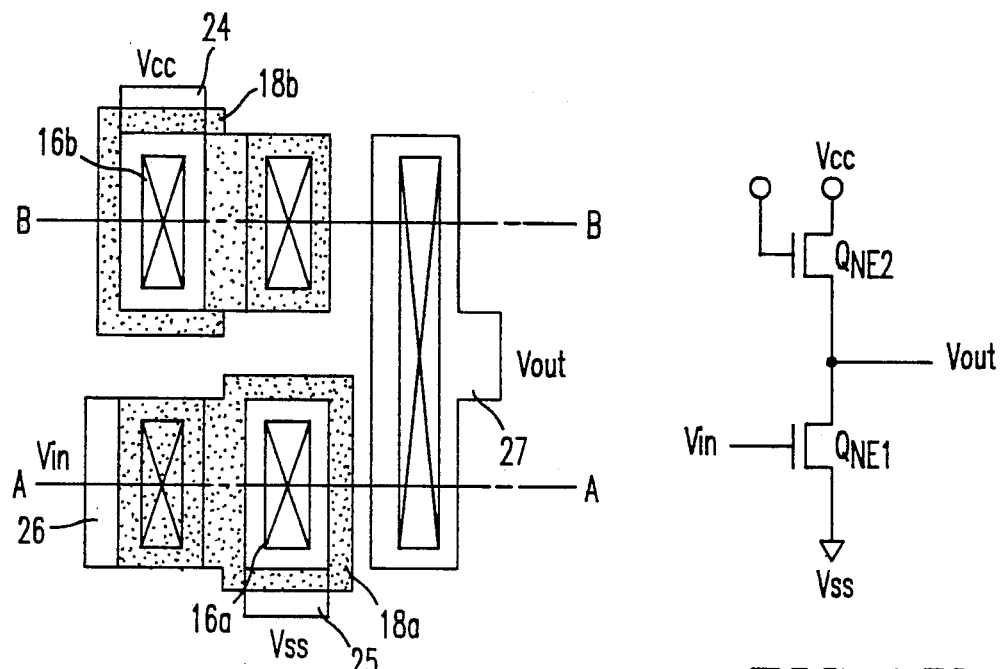
FIG. 15a
FIG. 15b
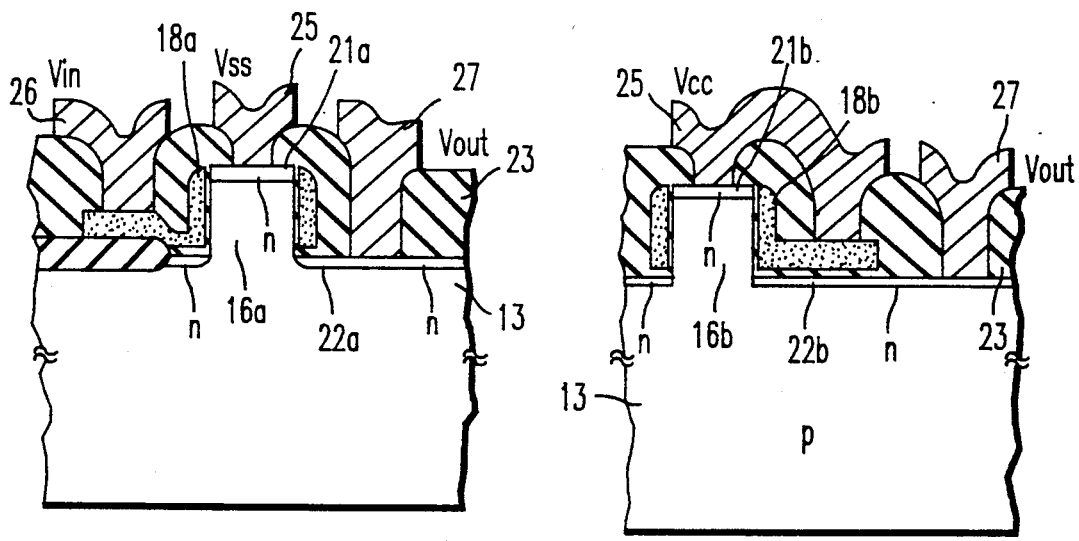
FIG. 16a
FIG. 16b

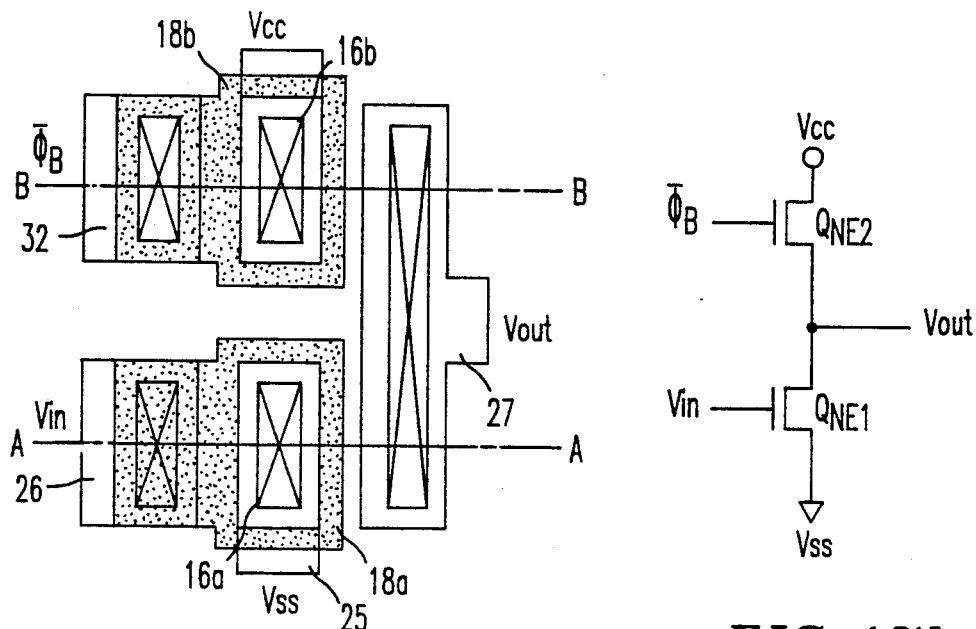
FIG. 17a
FIG. 17b
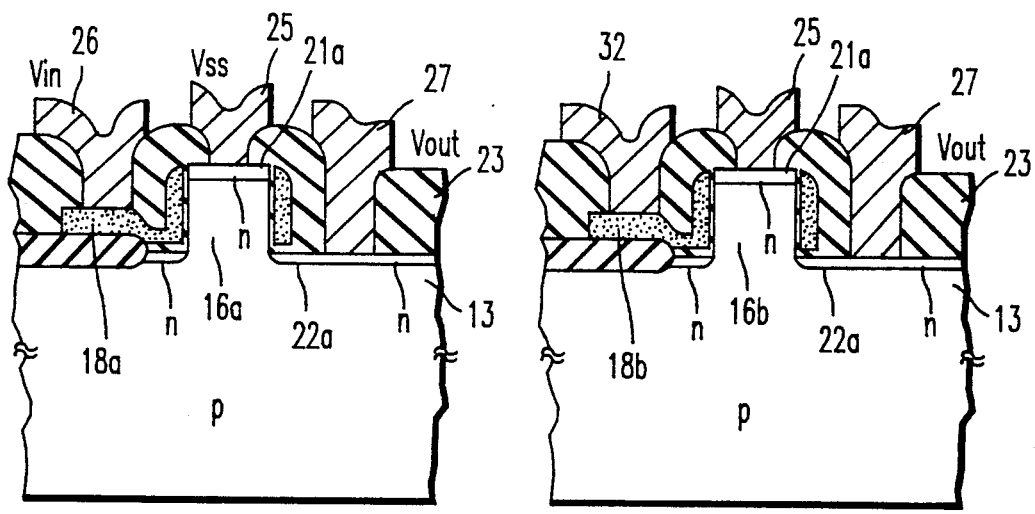
FIG. 18a
FIG. 18b

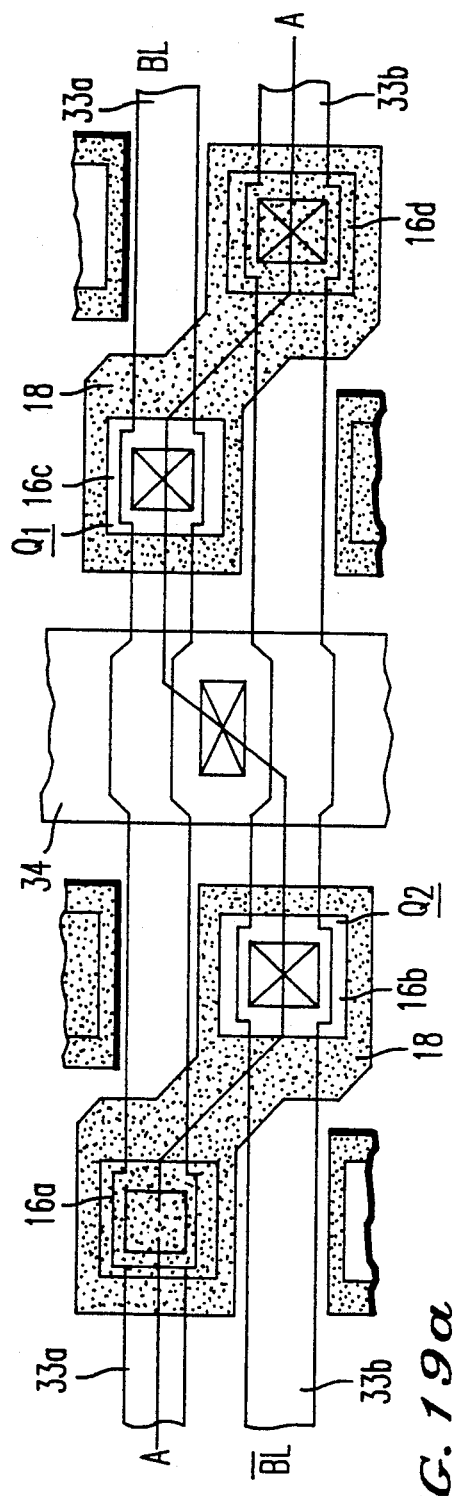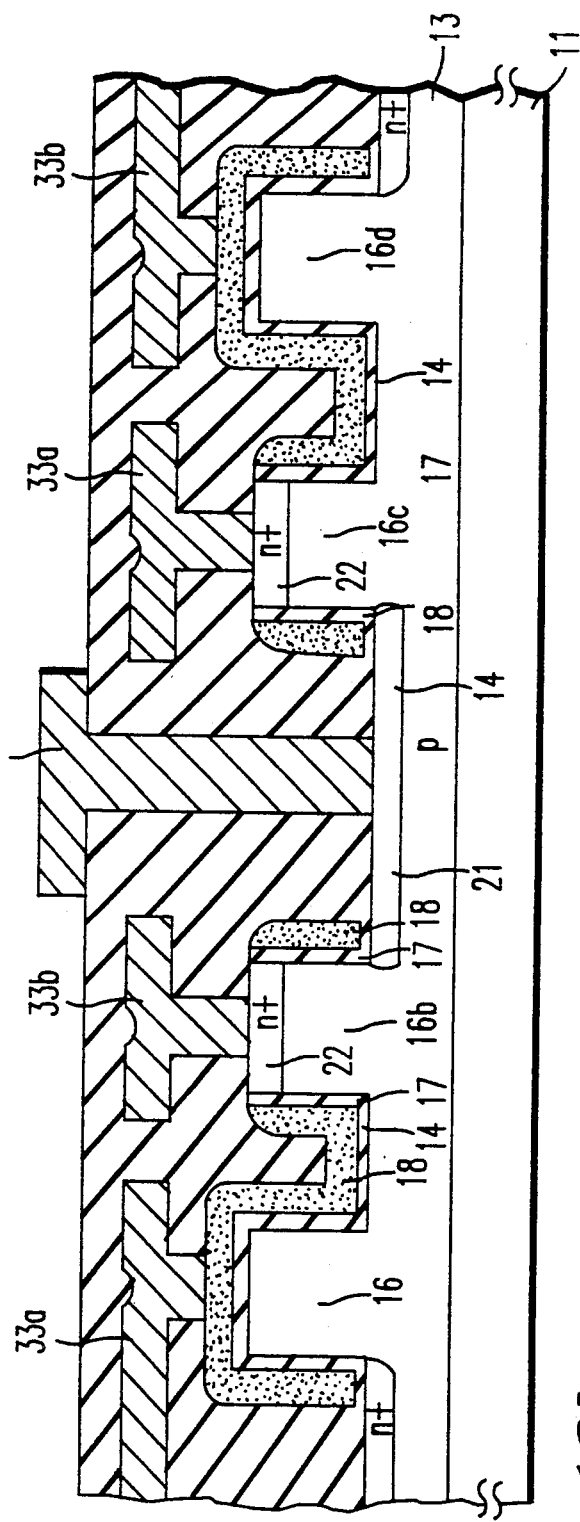
FIG. 19a
FIG. 19b

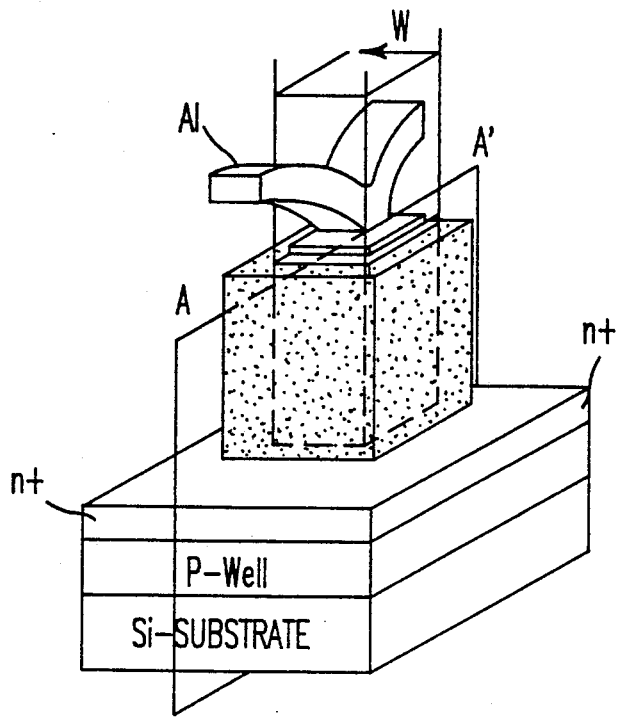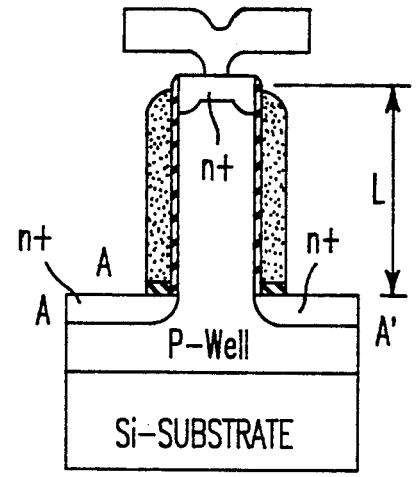
*FIG. 20a*  *FIG. 20b*
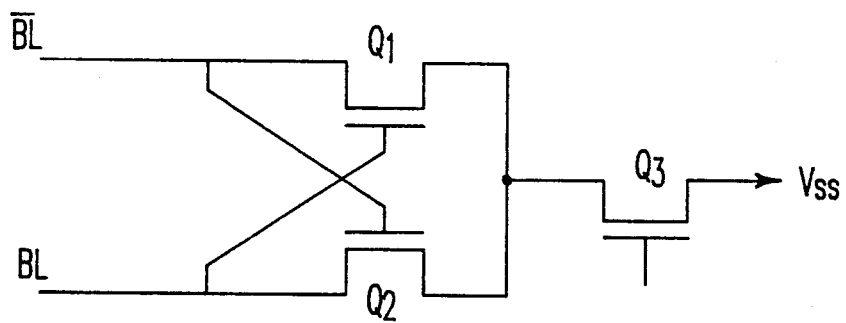
*FIG. 21*

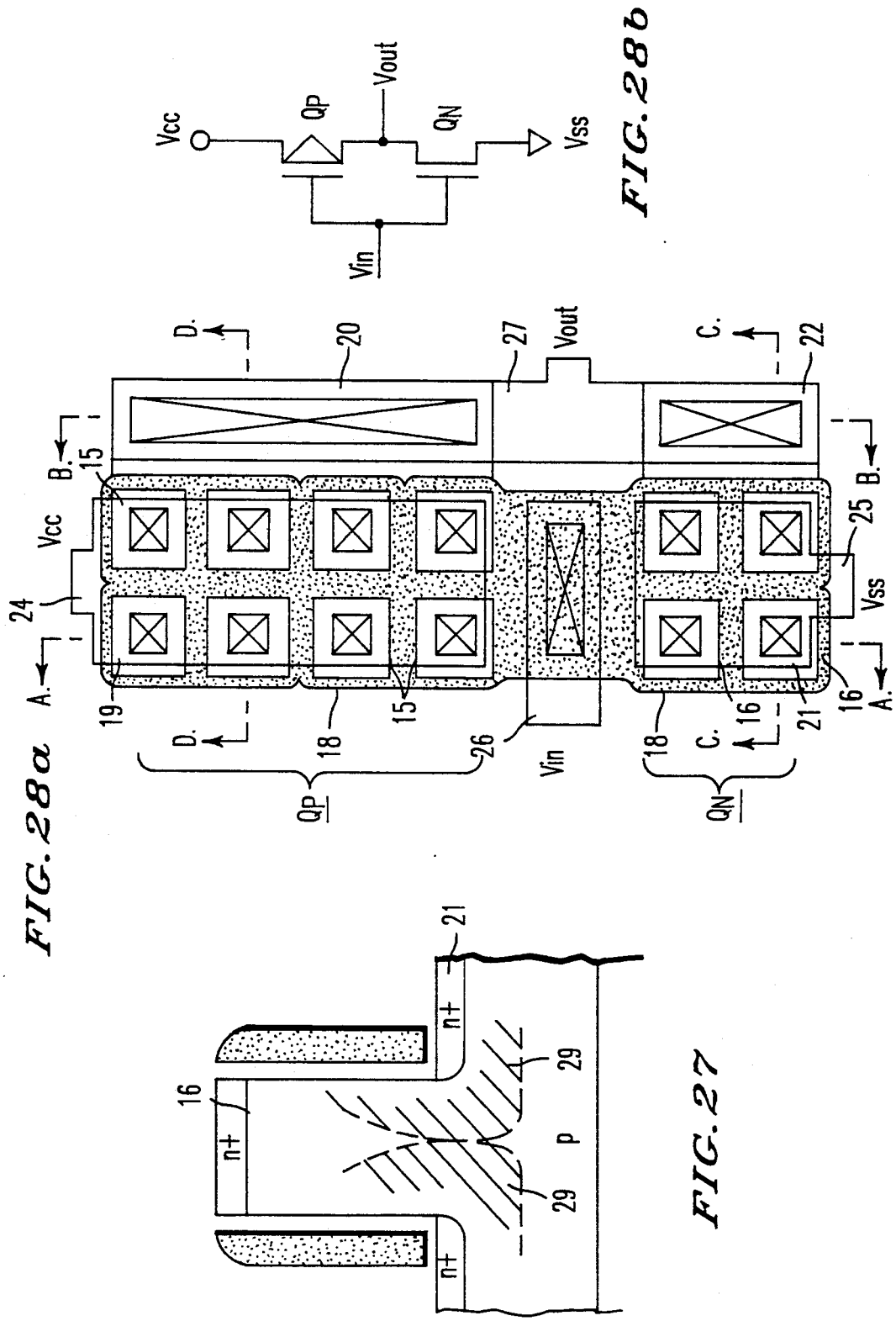

P-ch
W=38.4μm
L=0.5μm n-ch
W=19.2μm
L=0.5μm

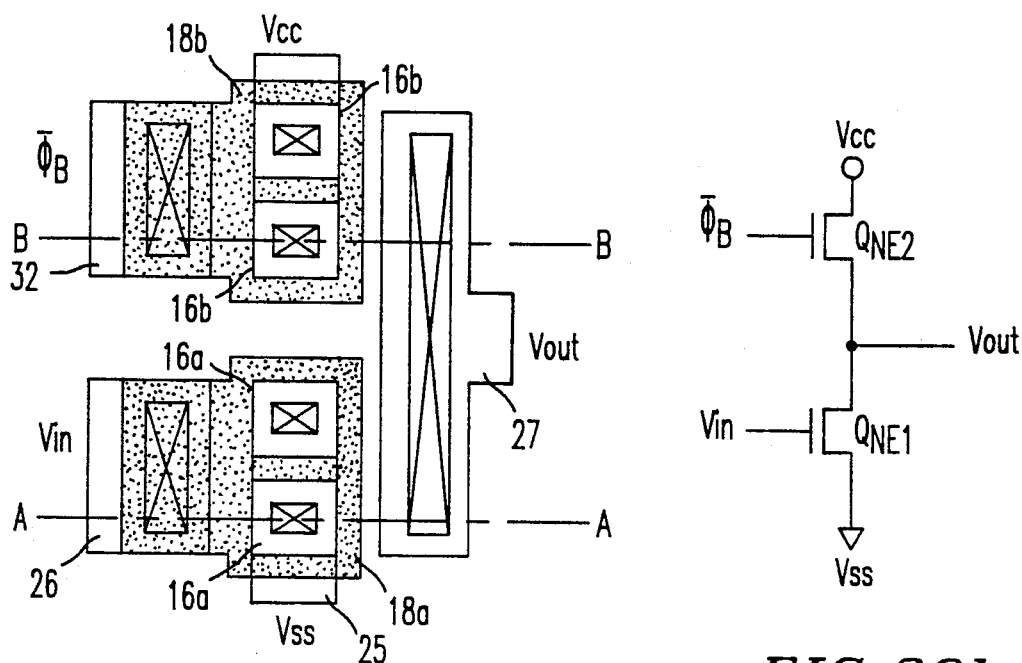
FIG.39a
FIG.39b
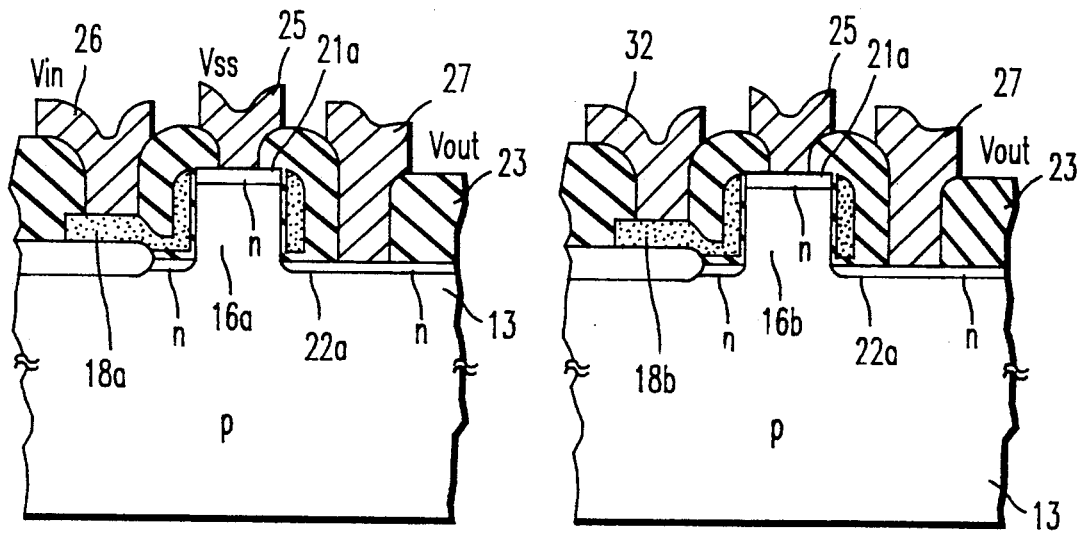
FIG.40a
FIG.40b 5,258,635

MOS-TYPE SEMICONDUCTOR INTEGRATED CIRCUIT DEVICE

This is a continuation of Ser. No. 07/448,153 filed Dec. 8, 1989, now abandoned, which was a continuation-in-part of Ser. No. 07/443,229 filed Sep. 5, 1989 now abandoned.

BACKGROUND OF THE INVENTION

1. Field of the Invention:

This invention relates to a MOS-type semiconductor integrated circuit device, and more particularly to an integrated circuit device incorporating MOS transistors formed in a vertical configuration.

2. Description of the Prior Art:

In recent years, the packing density of integrated circuits (hereinafter referred to as IC) incorporating MOS transistors has been steadily increasing. To achieve a higher-density integration of such ICs, MOS transistors incorporated therein have been miniaturized into submicron regions. The basic circuit of digital ICs is usually an inverter circuit, which is constituted by MOS transistors. As the miniaturization of such MOS transistors progresses, various disadvantageous phenomena occur as follows. First, as the gate sizes of the MOS transistors are reduced, a punchthrough occurs between the source and drain regions. This is caused by a so-called short-channel effect. Thus, a leakage current between the source and drain regions can hardly by suppressed. As a result, a standby current of the inverter circuit increases. Second, the miniaturization of MOS transistors causes the internal electric fields thereof to be stronger. Thus, the threshold values and mutual conductances of the MOS transistors fluctuate depending on a so-called hot-carrier effect. As a result, the characteristics of the MOS transistors are deteriorated. This deteriorates the characteristics of the inverter circuit, i.e., both the operating speed and operating margin thereof are reduced. Third, when the gate lengths of MOS transistors are reduced to achieve the miniaturization thereof, the reductions of gate widths inevitably are limited so as to securely maintain a prescribed current-carrying capacity. As a result, it is difficult to sufficiently reduce the inverter circuit area. For example, in the configuration of a DRAM (dynamic random access memory), the miniaturization of memory cells, per se, is significantly progressing. However, the peripheral circuit of such memory cells, which is about 40% of the entire chip area, cannot be sufficiently miniaturized because of the above-described gate size restriction. This prevents the miniaturization of the total DRAM chip size.

Further, when a gate electrode region is made of a polysilicon film, the CR time constant is constituted by a polysilicon film resistance and a gate capacitance. This CR time constant causes a delay in gate signal transmission. As the miniaturization of an MOS transistor progresses, a gate oxide film becomes thinner, and a gate capacitance increases. Thus, the CR time constant also increases. As a result, the delay in gate signal transmission dominates the switching time of the inverter circuit. Moreover, the contact capacitance between source and drain regions also increases along with the miniaturization of the device. As a result, the switching speed of the inverter circuit is decreased.

As described above, in the conventional technique of manufacturing MOS ICs, it is difficult to suppress the leakage current of the MOS inverter circuits. Further, the above-described hot carrier effect causes the reliability of the circuits to be lowered. Moreover, the circuit area cannot be sufficiently reduced because of the requirements to maintain a prescribed current-carrying capacity. In addition, the gate widths of the circuits must be small to reduce the signal delay at the gate electrodes of the circuits. These disadvantages exist not only in the MOS inverter circuits, but also in the MOS flip-flop circuit configuration.

SUMMARY OF THE INVENTION

Accordingly, one object of this invention is to provide an integrated circuit using MOS transistors formed in a vertical configuration that can reduce the circuit chip area thereof while maintaining a prescribed current-carrying capacity.

Briefly, in accordance with one aspect of this invention, there is provided a MOS-type semiconductor integrated circuit device which comprises a semiconductor substrate having a pillar layer of a first conductive-type formed thereon, a gate insulating film formed on the outer circumferential surface of the pillar layer for surrounding the same, a first region of a second conductive-type formed on the upper surface of the pillar layer, a second region of a second conductive-type formed on the bottom substrate surface, a gate conductive film formed on the surface of the gate insulating film, and a plurality of electrodes for electrically connecting to the gate conductive film, the first and second regions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b is a diagram illustrating an equivalent circuit of FIG. 1a;

FIG. 2a is a cross-sectional view taken along line A—A of FIG. 1a;

FIG. 2b is a cross-sectional view taken along line B—B of FIG. 1a;

FIG. 2c is a cross-sectional view taken along line C—C of FIG. 1a;

FIG. 2d is a cross-sectional view taken along line D—D of FIG. 1a;

FIG. 6b is a cross-sectional view schematically illustrating the MOS transistor of FIG. 6a;

FIGS. 7a, 7b, 8a and 8b are graphs for comparing the operation characteristics of the first embodiment according to the present invention with those of the conventional counterpart;

FIG. 9a and 9b are a plan view for comparing the circuit area of the first embodiment according to the present invention with that of the conventional counterpart;

FIG. 11a is a plan view illustrating a third embodiment according to the present invention;

FIG. 11b is a diagram illustrating an equivalent circuit of FIG. 11a;

FIG. 12a is a cross-sectional view taken along line A—A of FIG. 11a;

FIG. 12b is a cross-sectional view taken along line B—B of FIG. 11a;

FIG. 13b is a diagram illustrating an equivalent circuit of FIG. 13a;

FIG. 14a is a cross-sectional view taken along line A—A of FIG. 13a;

FIG. 14b is a cross-sectional view taken along line B—B of FIG. 13a;

FIG. 15a is a plan view illustrating a fifth embodiment according to the present invention;

FIG. 15b is a diagram illustrating an equivalent circuit of FIG. 15a;

FIG. 16a is a cross-sectional view taken along line A—A of FIG. 15a;

FIG. 16b is a cross-sectional view taken along line B—B of FIG. 15a;

FIG. 17a is a plan view illustrating a sixth embodiment according to the present invention;

FIG. 17b is a diagram illustrating an equivalent circuit of FIG. 17a;

FIG. 18a is a cross-sectional view taken along line A—A of FIG. 17a;

FIG. 18b is a cross-sectional view taken along line B—B of FIG. 17a;

FIG. 19a is a plan view illustrating a seventh embodiment according to the present invention;

FIG. 19b is a cross-sectional view taken along line A—A of FIG. 19a;

FIG. 20a is a schematic perspective view illustrating one of MOS transistors constituting the seventh embodiment according to the present invention;

FIG. 20b is a cross-sectional view schematically illustrating the MOS transistor of FIG. 20a;

FIG. 21 is a diagram illustrating an equivalent circuit of FIG. 19a;

FIG. 27 is a schematic cross-sectional view for explaining the operation characteristics of the eighth embodiment according to the present invention;

FIG. 28a is a plan view illustrating a ninth embodiment according to the present invention;

FIG. 28b is a diagram illustrating an equivalent circuit of FIG. 28a;

FIG. 29a is a cross-sectional view taken along line A—A of FIG. 28a;

FIG. 29b is a cross-sectional view taken along line B—B of FIG. 28a;

FIG. 29c is a cross-sectional view taken along line C—C of FIG. 28a;

FIG. 29d is a cross-sectional view taken along line D—D of FIG. 28a;

FIG. 33b is a diagram illustrating an equivalent circuit of FIG. 33a;

FIG. 34a is a cross-sectional view taken along line A—A of FIG. 33a;

FIG. 34b is a cross-sectional view taken along line B—B of FIG. 33a;

FIG. 35b is a diagram illustrating an equivalent circuit of FIG. 35a;

FIG. 36a is a cross-sectional view taken along line A—A of FIG. 35a;

FIG. 36b is a cross-sectional view taken along line B—B of FIG. 35a;

FIG. 37a is a plan view illustrating a thirteenth embodiment according to the present invention;

FIG. 37b is a diagram illustrating an equivalent circuit of FIG. 13a;

FIG. 38a is a cross-sectional view taken along line A—A of FIG. 37a;

FIG. 38b is a cross-sectional view taken along line B—B of FIG. 37a;

FIG. 39a is a plan view illustrating a fourteenth embodiment according to the present invention;

FIG. 39b is a diagram illustrating an equivalent circuit of FIG. 39a;

FIG. 40a is a cross-sectional view taken along line A—A of FIG. 39a;

FIG. 40b is a cross-sectional view taken along line B—B of FIG. 39a;

FIG. 41b is a cross-sectional view taken along line A—A of FIG. 41a;

FIG. 42 is a diagram illustrating an equivalent circuit of FIG. 41a;

FIG. 46b is a diagram illustrating an equivalent circuit of FIG. 46a;

FIG. 47a is a cross-sectional view taken along line A—A of FIG. 46a;

FIG. 47b is a cross-sectional view taken along line B—B of FIG. 46a;

FIG. 47c is a cross-sectional view taken along line C—C of FIG. 46a;

FIG. 47d is a cross-sectional view taken along line D—D of FIG. 46a;

FIG. 49a is a plan view illustrating eighteenth embodiment according to the present invention;

FIG. 49b is a diagram illustrating an equivalent circuit of FIG. 49a;

FIG. 50a is a cross-sectional view taken along line A—A of FIG. 49a;

FIG. 50b is a cross-sectional view taken along line B—B of FIG. 49a;

FIG. 50c is a cross-sectional view taken along line C—C of FIG. 49a;

FIG. 50d is a cross-sectional view taken along line D—D of FIG. 49a;

FIG. 51b is a cross-sectional view taken along line A—A of FIG. 51a;

FIG. 51c is a diagram illustrating an equivalent circuit of FIG. 51a;

DESCRIPTION OF THE PREFERRED EMBODIMENTS

Figure 1A:
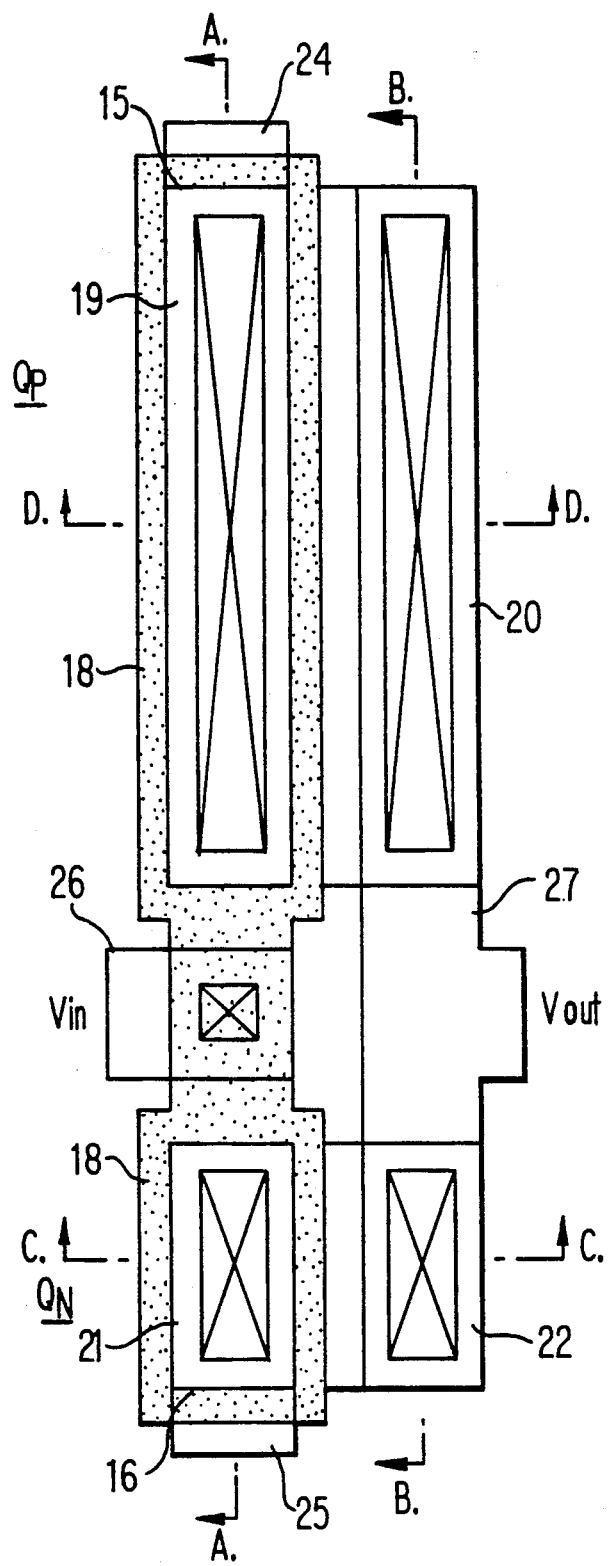
FIG. 1a is a plan view illustrating a first embodiment according to the present invention.

Referring not to the drawings, wherein like reference numerals designate identical or corresponding parts throughout the several views, and more particularly to FIG. 1 thereof, a first embodiment of this invention will be described.

Figure 1B:
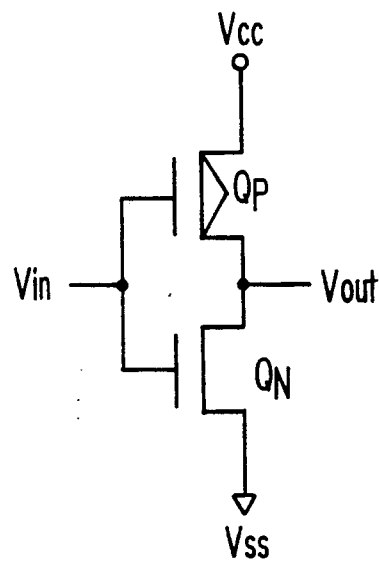
Figure 2A:
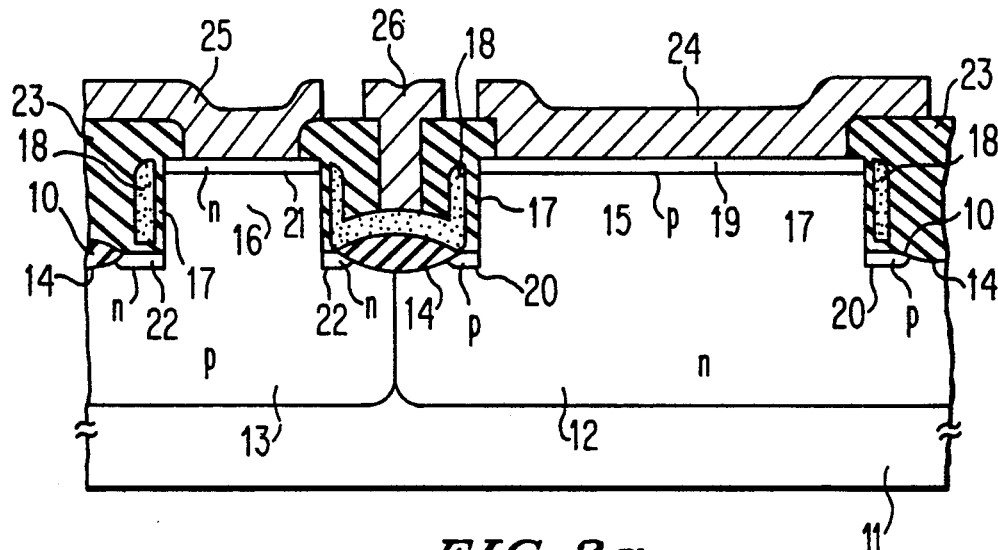
Figure 2B:
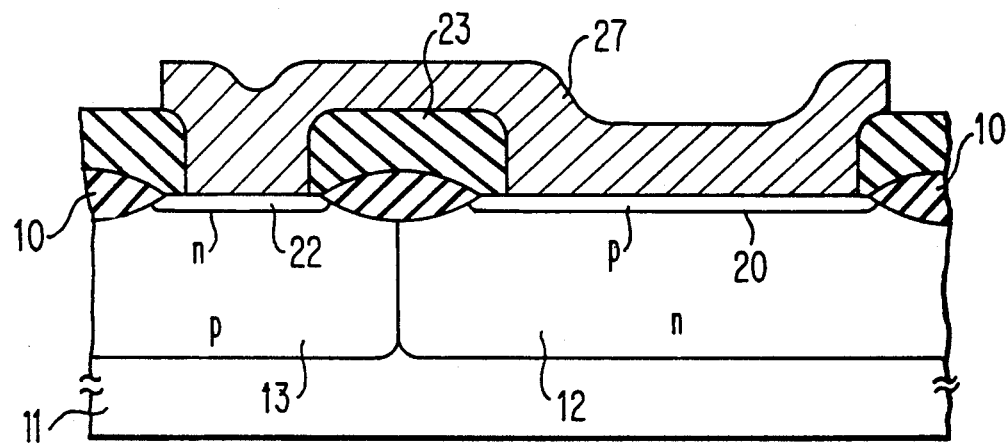
Figure 2C:
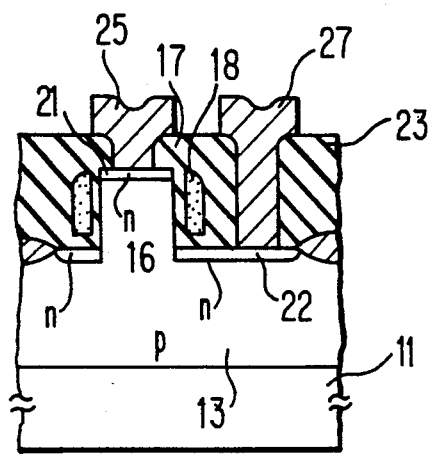
Figure 2D:
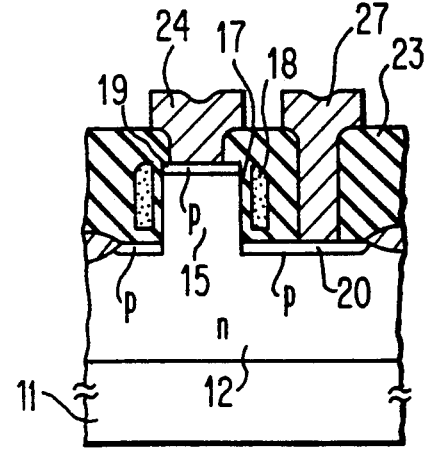

FIG. 1a is a plan view illustrating a CMOS inverter circuit of a first embodiment according to the present invention, and FIG. 1b shows an equivalent circuit thereof. FIGS. 2a through 2d are cross-sectional views taken along lines A—A, B—B, C—C and D—D of FIG. 1, respectively. An n-type well 12 and a p-type well 13 are formed on a silicon substrate 11. Silicon pillar layers 15 and 16, which are island-shaped projections, are formed being surrounded with a continuous trench 14 in the n-type well 12 and the p-type well 13, respectively. A p-channel MOS transistor Qp and an n-channel MOS transistor Qn are respectively formed in the pillar layers 15 and 16.

The MOS transistors Qp and Qn are formed in a vertical configuration having the inner circumferential surfaces of the respective pillar layers 15 and 16 as channel regions. Specifically, a prescribed element isolation oxide film 10 is formed in the trench 14. A gate oxide film 17 is formed on the outer circumferential surfaces of the pillar layers 15 and 16. A gate electrode 18 of the MOS transistor Qp is formed as follows. Specifically, a p+-type polysilicon film is deposited in the trench 14. Thereafter, the polysilicon film is eliminated except that deposited on the portions immediately close to the outer circumferential surfaces of the pillar layers 15.

This is performed by use of an anisotropic etching technique such as a resist-processing and a reactive ion etching (RIE). As a result, the gate electrode 18 of the MOS transistor Qp is obtained. A gate electrode 18 of the MOS transistor Qn is formed by depositing an n+-type polysilicon film in the trench 14. Thereafter, the same process as in the case of the MOS transistor Qp is performed near the outer circumferential surfaces of the pillar layers 16. Thereafter, a source region 19 and a drain region 20 of the p-channel MOS transistor Qp are formed by ion-implantation of p-type impurities. Further, a source region 21 and a drain region 22 of the n-channel MOS transistor Qn are formed by ion-implantation of n-type impurities. Specifically, the source regions 19 and 21 are respectively formed on the upper surfaces of the pillar layers 15 and 16. Further, the drain regions 20 and 22 are respectively formed at the bottoms of the trench 14. The surface of the substrate on which the MOS transistors Qp and Qn have been formed is covered with a CVD oxide film 23. Next, Al films are formed filling in contact holes made in the oxide film 23. Thereafter, the Al films are patterned to form prescribed terminal leads such as a Vcc lead 24, a Vss lead 25, an input terminal (Vin) lead 26 and an output terminal (Vout) lead 27.

Figure 3:
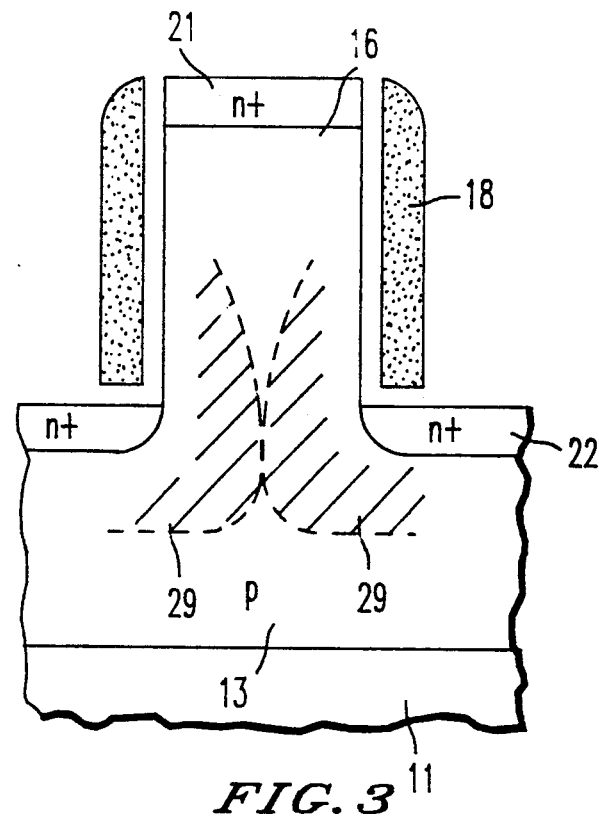
FIG. 3 is a schematic cross-sectional view for explaining the operation characteristics of the first embodiment according to the present invention.

In this embodiment, the parameters of the respective elements are determined as follows. Specifically, in the case of channel inversion, the respective pillar layers can be satisfactorily isolated from the lower portions thereof. FIG. 3 shows the inversion state of the n-channel MOS transistor Qn in more detail.

In FIG. 3, two depletion layers 29 extend from the drain region 22 formed at the bottom of the trench 14 so as to approach to each other. When two depletion layers 29 come in contact with each other, the pillar layer 16 becomes a so-called floating state. Namely, the pillar layer 16 is electrically isolated from the lower substrate region. In order to satisfy the above-described condition, the impurity concentration of the p-type well 13 must by about $3 \times 10^{16}/cm^3$. Further, the width of the pillar layer 16 must be about 1 $\mu$m, and the thickness of the gate oxide film 18 must be about 120 Å. The same condition can be applied to the p-channel MOS transistor Qp of FIGS. 1a and 1b.

Next, the advantages of the inverter circuit according to this embodiment of the present invention will be described in comparison with the structure of a conventional inverter circuit. In this embodiment, the channel lengths of both the p-channel and N-channel MOS transistors Qp and Qn are substantially the same as the depth of the trench 14. Assume that the channel widths of the transistors Qp and Qn are required to be 12 $\mu$m and 6 $\mu$m, respectively. The required channel widths can be obtained when the pattern widths of the pillar layers 15 and 16 are determined to be 1 $\mu$m. Further, the pattern lengths of the pillar layers 15 and 16 are respectively determined to be 5 $\mu$m and 2 $\mu$m, as shown in FIG. 1a.

Figure 4A:
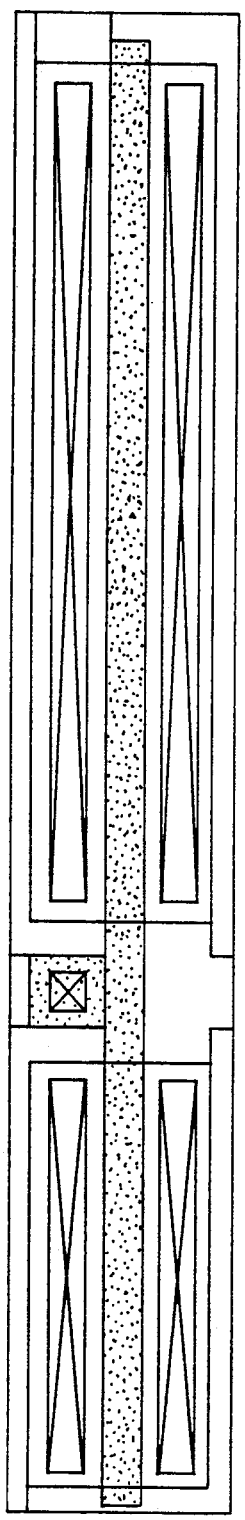
FIG. 4a and 4b are a plan view for comparing the first embodiment of this invention with a conventional counterpart.
Figure 4B:
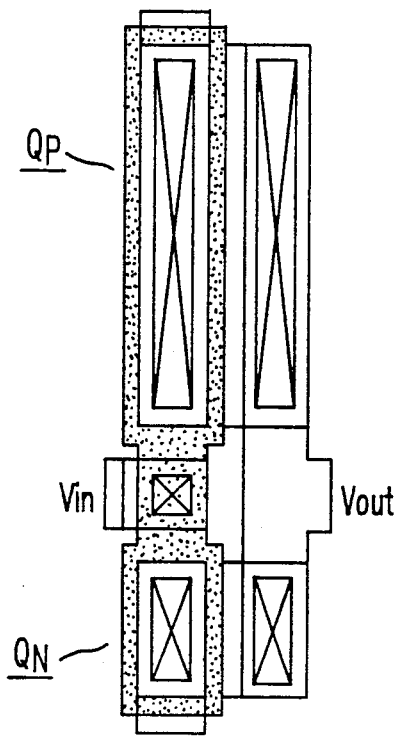

In this case, a total pattern area of FIG. 1a becomes about $3.25 \times 10 = 32.5$ $\mu m^2$. FIG. 4 shows the vertical configuration of the above-described CMOS inverter circuit of this invention and the planar configuration of a conventional CMOS inverter circuit for the sake of comparison. These circuits have the same current-carrying capacity. In the conventional CMOS inverter circuit (left side), the channel lengths of both the p- and n-channels are 0.5 $\mu$m. Further, the channel widths of p-channel and n-channel are 12 μm and 6 μm, respectively. In this case, a total area required to provide the circuit is about 3×21=63 μm². This means that the circuit area of the CMOS inverter circuit of this invention is reduced to about ½ of that of the conventional counterpart.

As described above, in this embodiment, a prescribed circuit area in the device can be significantly reduced. However, in a circuit portion in which only a small current-carrying capacity is required, the major area of such a portion is occupied by the contact hole area. Further, in terms of the contact hole area, per se, there is no difference between the devices of this invention and the conventional counterpart. Thus, this invention is advantageous when it is applied to a circuit portion in which a large current-carrying capacity is required. For example, when this invention is applied to the peripheral circuits of DRAMs, the circuit area therein can be significantly reduced while maintaining its large current-carrying capacity. In the process of manufacturing DRAMs, memory cells are fabricated in a trench capacitor configuration. Here, assume that the CMOS inverter circuits, which are the peripheral circuits of a DRAM, are trenched in accordance with this invention while the memory cell regions of the DRAM are trenched. This can significantly enhance the productivity in the process of manufacturing DRAMs.

Figure 5A:
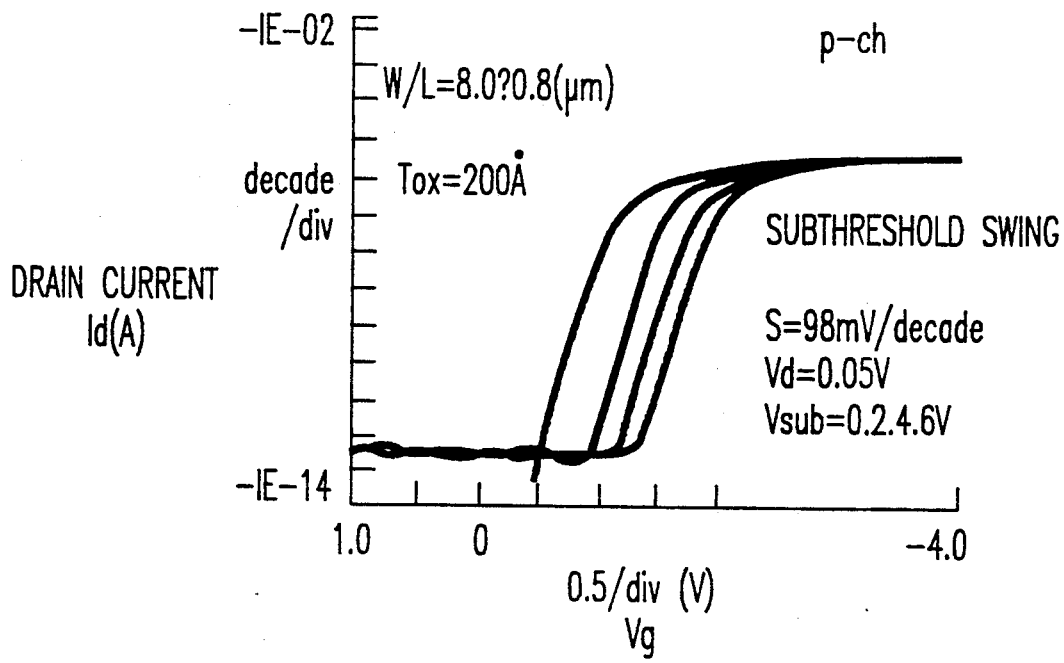
FIGS. 5a and 5b are graphs for comparing the static characteristics of the first embodiment of this invention with those of the conventional counterpart.
Figure 5B:
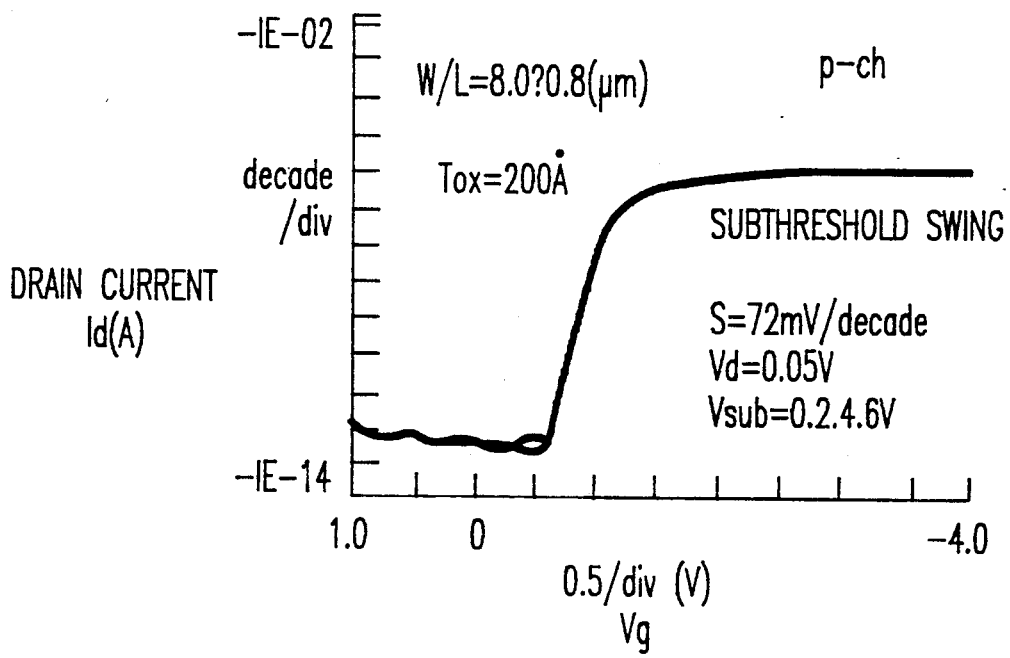

FIG. 5a shows the subthreshold characteristics of a conventional planar p-channel MOS transistor. FIG. 5b shows the subthreshold characteristics of the p-channel MOS transistor according to the first embodiment according to the present invention. The both transistors have the same channel dimensions:

W (channel width)=8.0 μm and

L (channel length)=0.8 μm.

Figure 6A:
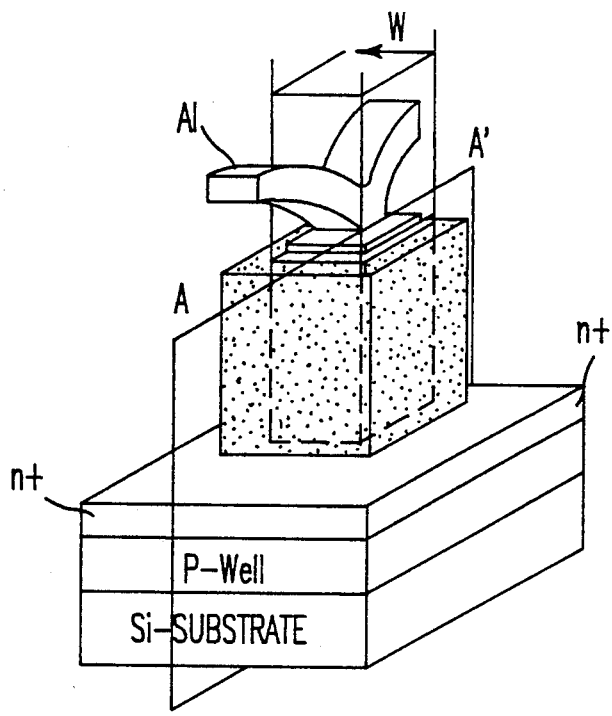
FIG. 6a is a schematic perspective view illustrating one of MOS transistors constituting the first embodiment according to the present invention.
Figure 6B:
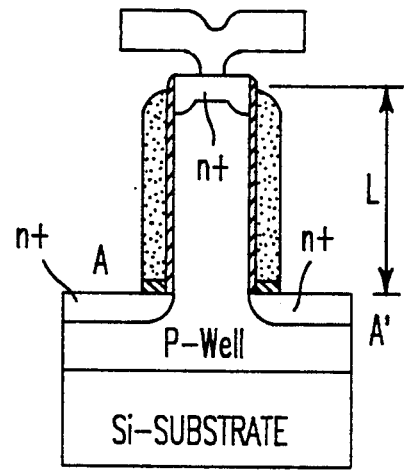

The relationship between the channel width W and the channel length L of the MOS transistor in this embodiment can be easily understood by referring to FIGS. 6a and 6b. The gate oxide films of both the transistors have the same thickness of 200 Å. In FIGS. 5a and 5b, the conditions of measurements are as follows. Specifically, a drain voltage Vd=0.05 V, and a substrate bias voltage Vsub is changed from 0 to 2, 4 and 6 V. The transistor of this embodiment has subthreshold characteristics which are apparently steeper than those of the conventional transistor.

Further, the swing S (S=dVg/d (log Id)) of the transistor in this embodiment is 72 mv/decade, which is very smaller than that (S=98 mv/decade) of the conventional transistor. This indicates that the transistor gate of this embodiment has a satisfactory controllability with respect to its channel, which is stronger than that of the conventional transistor. As a result, the standby current of the CMOS inverter circuit of this embodiment can be significantly suppressed. In FIG. 5a, the conventional transistor exhibits the scattering in subthreshold characteristics depending on variations of the substrate voltages (Vsub). The scattering occurs within a region in which a drain current rised, i.e., in which a channel inversion occurs.

In contrast to this, the transistor of this embodiment does not exhibit such scattering in the region, as shown in FIG. 5b. The reason of this can be explained as follows by referring to FIG. 3. Specifically, in the pillar layer, the transistor portion can be electrically isolated from the lower substrate region when a channel inversion occurs by the effect of the depletion layers 29. As a result, the subthreshold characteristics of the transistor of this embodiment are independent of the substrate bias variations. Further, the transistor of this invention exhibits satisfactory anti-noise characteristics with respect to the substrate.

Figure 7A:
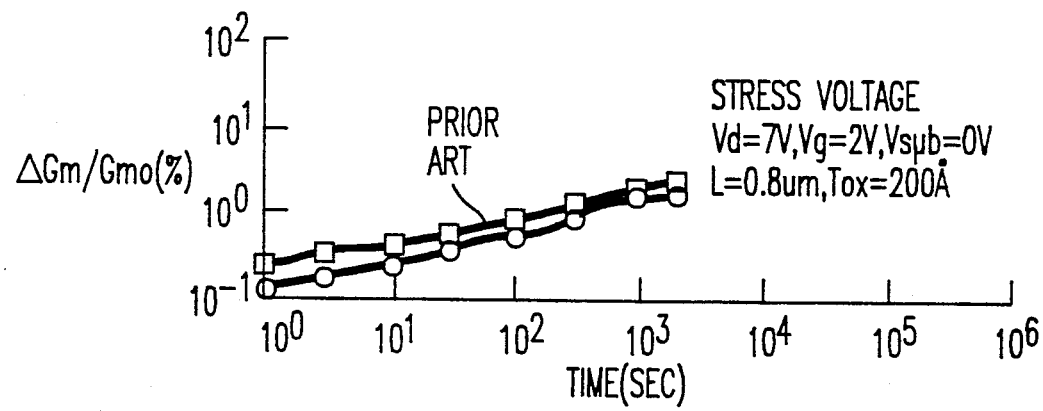
Figure 7B:
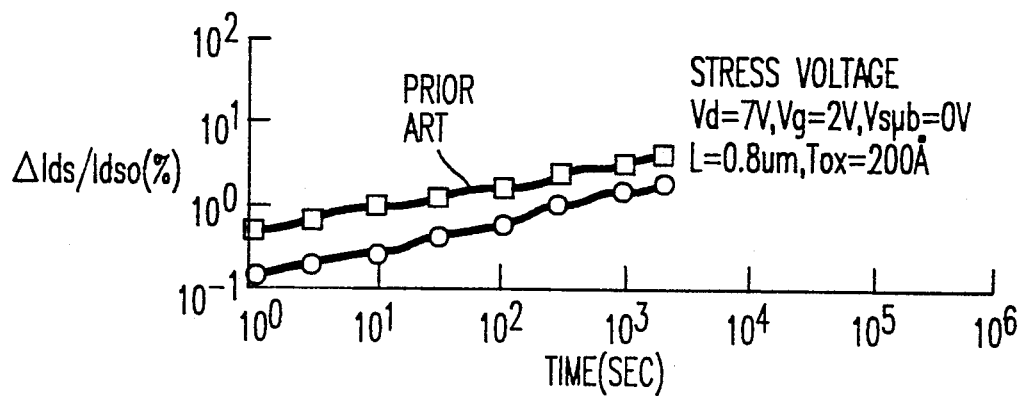

FIG. 7a is a graph illustrating the deterioration amounts of mutual conductance, ΔGm/Gmo (%), of both the conventional transistor and the transistor of this invention. FIG. 7b is a graph illustrating the deterioration amounts of drain current, ΔIds/Idso (%), of both the conventional transistor and the transistor of this invention. FIGS. 7a and 7b respectively show the relationships between such deterioration amounts and the time elapsed after stresses such as Vd, Vg and Vsub were applied to the respective transistors for the hot-carrier effect. As can be seen from these data, such deterioration amounts of the transistor of this invention are smaller than those of the conventional transistor. Therefore, in accordance with this invention, a CMOS inverter circuit constituted by highly reliable transistors can be obtained. This is also advantageous in terms of its operating speed and operating margins.

FIGS. 8a and 8b are graphs illustrating static characteristics of both the conventional transistors and the transistor of this invention. Both transistors have parameters in common such as W/L (channel width/channel length)=4.0 μm/0.8 μm, Tox (gate oxide film thickness)=200 Å and Vsub (substrate bias voltage)=Ov. As seen from these graphs, both transistors exhibit substantially the same drain current-carrying capabilities. However, in terms of circuit area, the conventional transistor is in an area of 5×6=30 μm², while the transistor of this invention is in an area of 5×2.4=12 μm², as shown in FIG. 9. Therefore, in accordance with the present invention, a high-density integration of various ICs can be achieved maintaining prescribed current-carrying capabilities.

Figure 10:
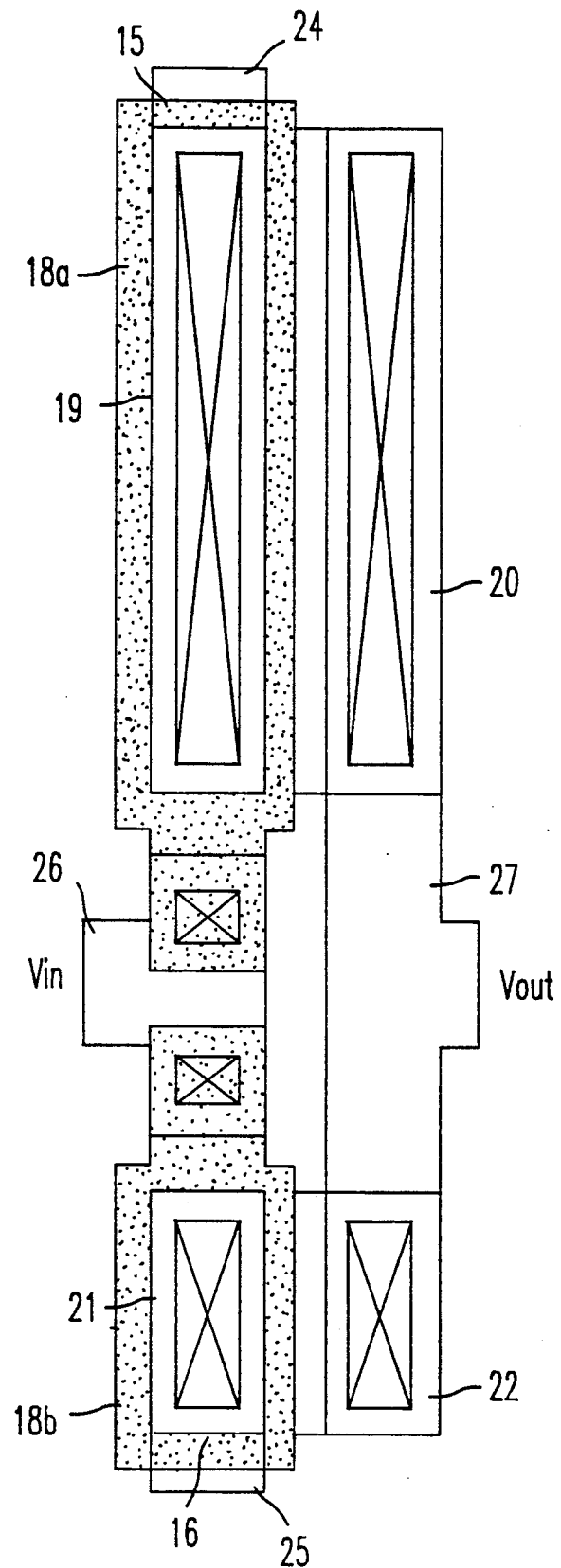
FIG. 10 is a plan view illustrating a second embodiment according to the present invention.

Next, a second embodiment of this invention will be described with reference to FIG. 10. In the first embodiment, the gate electrode 18 serves as both the gate electrodes of the n-channel MOS transistor and the p-channel MOS transistor. However, in the second embodiment, a gate electrode 18a of a p-channel MOS transistor is isolated from a gate electrode 18b of an n-channel transistor, as shown in FIG. 10. The gate electrodes 18a and 18b are electrically connected by an input lead 26. This configuration slightly increases a circuit area. However, optimum characteristics of the respective transistors can be easily achieved.

Next, a third embodiment of this invention will be described with reference to FIGS. 11a, 11b, 12a and 12b. FIG. 11a is a plan view illustrating an E/R-type (Enhancement/Resistor-type) inverter circuit. FIG. 11b shows an equivalent circuit of FIG. 11a. FIGS. 12a and 12b are cross-sectional views taken along lines A—A and B—B of FIG. 11a, respectively. In FIG. 12a, a pillar layer 16 is formed in a p-type well 13. In the pillar layer 16, an E-type MOS transistor Qn (n-channel) is formed in the same manner as in the first embodiment. A resistor 30 of polysilicon film is formed as a load element of the transistor Qn. This simplified configuration is more suitable for miniaturization of a circuit area.

Figure 13A:
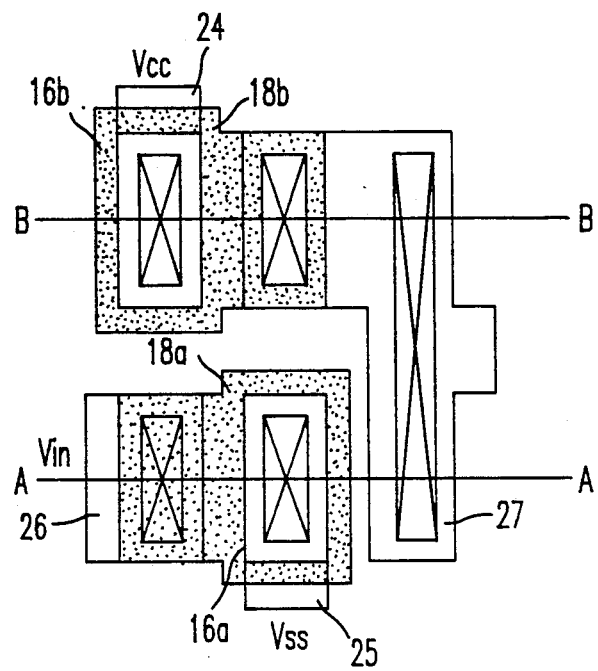
FIG. 13a is a plan view illustrating a fourth embodiment according to the present invention.
Figure 13B:
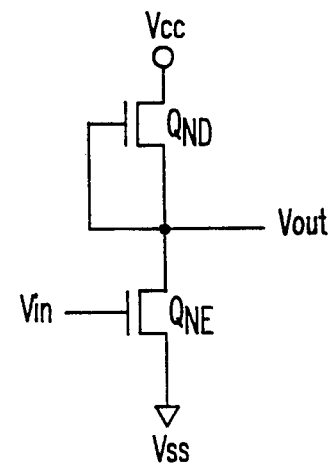
Figure 14A:
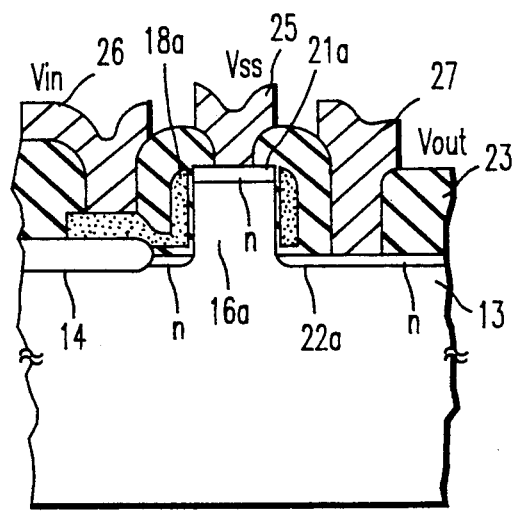
Figure 14B:
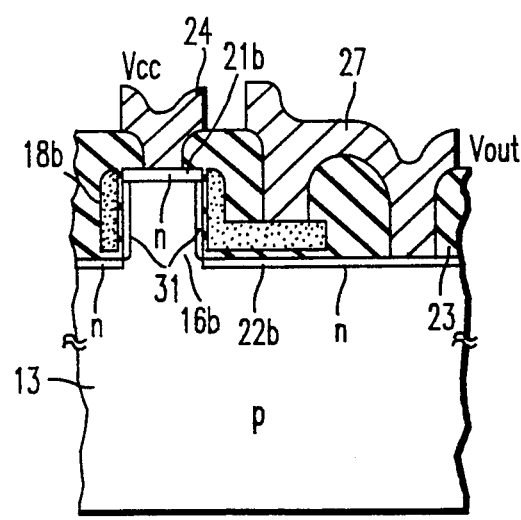

Next, a fourth embodiment of this invention will be described with reference to FIGS. 13a, 13b, 14a and 14b. FIG. 13a is a plan view illustrating an E/D-type (Enhancement/Depletion-type) inverter circuit, and FIG. 13b is an equivalent circuit thereof. FIGS. 14a and 14b are cross-sectional views taken along lines A—A and B—B of FIG. 13a, respectively. In this embodiment, pillar layers 16a and 16b are formed in a p-type well 13. An E-type MOS transistor $Q_{NE}$ is formed in the pillar layer 16a, and a D-type MOS transistor $Q_{ND}$ is formed in the pillar layer 16b. Specifically, source regions 21a and 21b, drain regions 22a and 22b, and gate electrodes 18a and 18b are formed in the pillar layer 16a and 16b, respectively. This formation is performed in the same manner as in the first embodiment. In this embodiment, the transistor $Q_{NE}$ serves as a driver, and the transistor $Q_{ND}$ serves as a load. In this case, an n-type layer 31 must be formed on the inner circumferential surface of the pillar layer 16b so as to constitute the D-type transistor $Q_{ND}$.

Next, a fifth embodiment of this invention will be described with reference to FIGS. 15a, 15b, 16a and 16b. FIG. 15a is a plan view illustrating an E/E-type (Enhancement/Enhancement-type) inverter circuit, and FIG. 15b is an equivalent circuit thereof. FIGS. 16a and 16b are cross-sectional views taken along lines A—A and B—B of FIG. 15a, respectively. The E/E-type inverter circuit in this embodiment differs from the first embodiment in that both a driver and a load are E-type MOS transistors $Q_{NE1}$ and $Q_{NE2}$. Further, the gate of the transistor $Q_{NE2}$ (load) is connected to a Vcc lead 24.

Next, a sixth embodiment of this invention will be described with reference to FIGS. 17a, 17b, 18a and 18b. FIG. 17a is a plan view illustrating a dynamic-type inverter circuit, and FIG. 17b shows an equivalent circuit thereof. FIGS. 18a and 18b are cross-sectional views taken along lines A—A and B—B of FIG. 17a, respectively. The dynamic-type inverter circuit in this embodiment differs from the first embodiment in that an independent terminal lead 32 is connected to a gate electrode 18b of a transistor $Q_{NE2}$ (load). Further, the gate electrode 18b receives a signal $\phi_B$, which is obtained by inverting and amplifying an input signal Vin.

Next, a seventh embodiment of this invention will be described with reference to FIGS. 19a, 19b, 20a, 20b and 21. FIG. 19a is a plan view illustrating a flip-flop circuit, and FIG. 19b is a cross-sectional view taken along line A—A of FIG. 19a. The flip-flop circuit is used for a bit-line sense-amplifier of a DRAM. The flip-flop circuit comprised two n-channel MOS transistors $Q_1$ and $Q_2$. A p-type well 13 is formed on a silicon substrate 11. A plurality of pillar layers 16a, 16b, 16c and 16d are formed in the p-type well 13. These pillar layers 16a through 16d project so as to form islands surrounded with a trench 14. The MOS transistor $Q_1$ is constituted by the pillar layer 16c, and the MOS transistor $Q_2$ is constituted by the pillar layer 16b. Specifically, gate insulating films 17 are formed on the outer circumferential surfaces of the pillar layers 16c and 16b. Gate electrodes 18 of polysilicon film are formed in the trench 14 so as to surround the outer circumferential surfaces of the pillar layers 16c and 16b. On the upper surfaces of the pillar layers 16c and 16b, n+-type diffusion layer 22 are formed as drain regions of the MOS transistors $Q_1$ and $Q_2$. In the trench 14, n+-type diffusion layers 21 are formed as source regions of the MOS transistors $Q_1$ and $Q_2$. A pair of bit lines 33a and 33b of polysilicon films as formed so as to respectively contact the drain layers of the MOS transistors $Q_1$ and $Q_2$. The gate electrode 18 of the MOS transistor $Q_1$ is extended to the upper portion of the pillar layer 16d, and connected to the bit line 33b thereon, as shown in FIGS. 19a and 19b. The gate electrode 18 of the MOS transistor $Q_2$ is extended to the upper portion of the pillar layer 16a, and connected to the bit line 33a thereon, as shown in FIGS. 19a and 19b.

In this case, the pillar layers 16a and 16d are not provided to form the MOS transistors, but as pedestrals that achieve secure connection between the bit lines and the gate electrodes. Specifically, the gate electrodes 18 and the drain regions 22 can be formed at substantially the same level. As a result, the depths of the holes through which the drain regions and the gate electrodes are connected to the bit lines can be determined uniformely. The source regions 21 formed at the bottom of the trench 14 are common source nodes to which an Al lead 34 is connected, as shown in FIG. 19b. Further, the common source modes 21 are connected to a ground potential Vss interposing a MOS transistor $Q_3$ therebetween for activation, as shown in an equivalent circuit of FIG. 21. Moreover, p-channel MOS transistors can also be formed along the same bit lines so as to constitute a PMOS sense-amplifier in the same manner as described above.

Figure 22A:
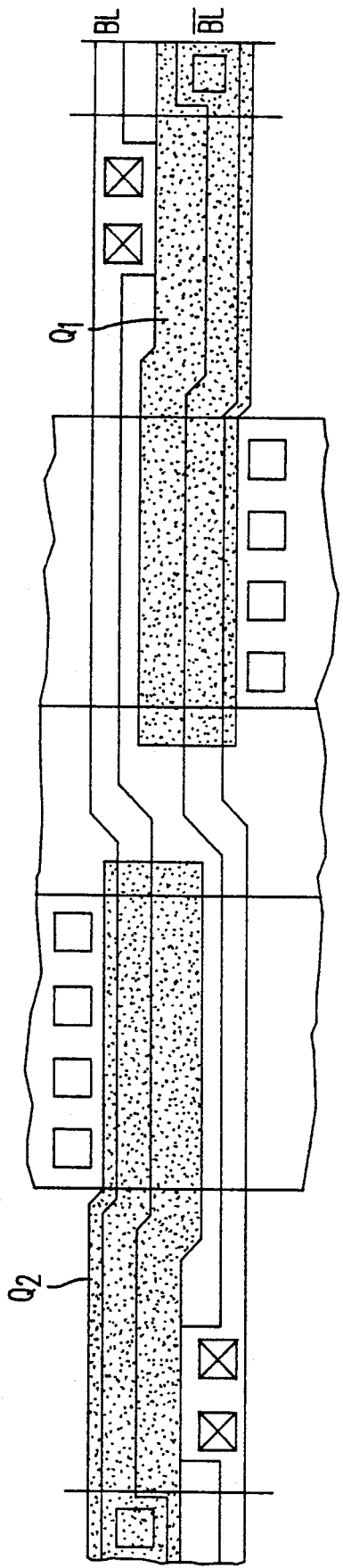
FIG. 22a and 22b are a plan view for comparing the seventh embodiment of this invention with a conventional counterpart.
Figure 22B:
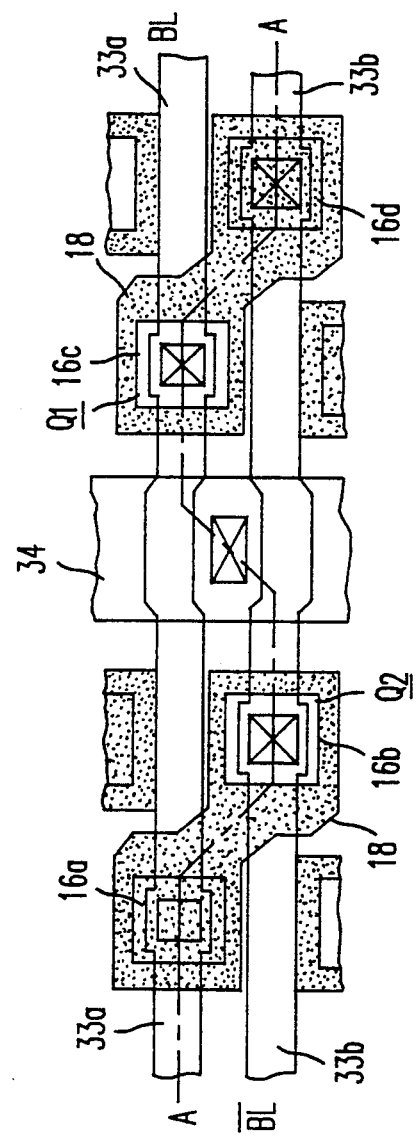
Figure 23:
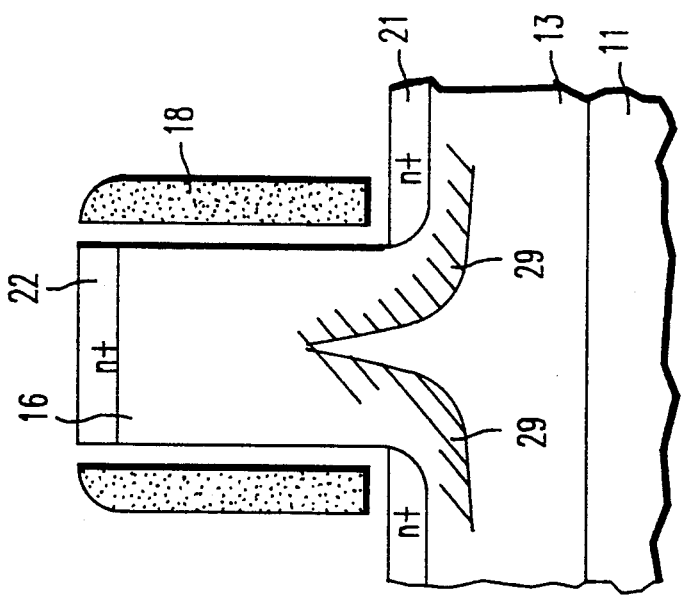
FIG. 23 is a schematic cross-sectional view for explaining the operation characteristics of the seventh embodiment according to the present invention.

In this embodiment, the gate width W of the MOS transistor corresponds to the outer circumference of the pillar layer 16, as shown in FIG. 20a. Thus, the circuit area of the flip-flop circuit according to this embodiment can be significantly reduced, as shown in FIG. 22 wherein the conventional counterpart is illustrated for the sake of comparison. FIG. 23 is a schematic diagram for explaining the operation of the MOS transistor that constitutes the flip-flop circuit of this embodiment. When a voltage is applied to the gate electrode 18, two depletion layers 29 simultaneously extend toward the center portion of the pillar layer 16, as shown in FIG. 23. Thus, the resistance between the drain region 22 and the source region 21 becomes sufficiently greater. Therefore, the flip-flop operation can be performed independently of the substrate noises.

As described above, according to this embodiment, the circuit area of a DRAM bit-line sense-amplifier can be significantly reduced. The device of this embodiment has very small leakage currents, and is independent of the hot-carrier effect and the substrate noises.

Next, an eighth embodiment of this invention will be described with reference to FIGS. 24 through 27. A typical SRAM (static random access memory) has memory cells constituted by flip-flop circuits of MOS transistors. In this embodiment, the flip-flop circuit can also be fabricated in a vertical configuration using a plurality of pillar layers in the same manner as that in the seventh embodiment.

Figure 24:
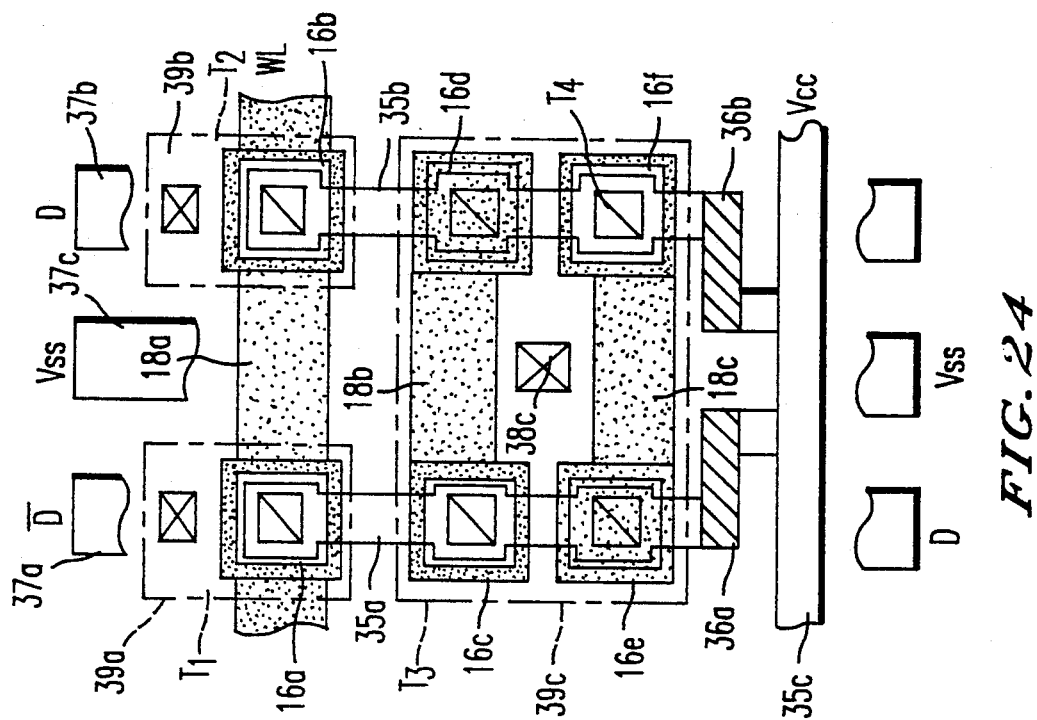
FIG. 24 is a plan view illustrating an eighth embodiment according to the present invention.
Figure 25:
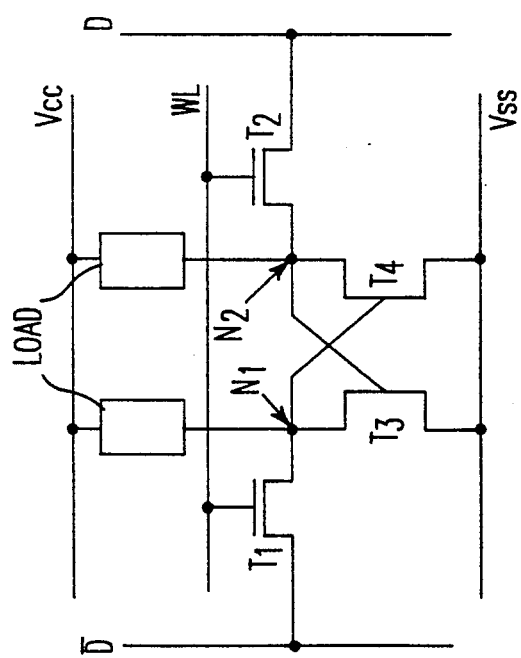
FIG. 25 is a diagram illustrating an equivalent circuit of FIG. 24.
Figure 29A:
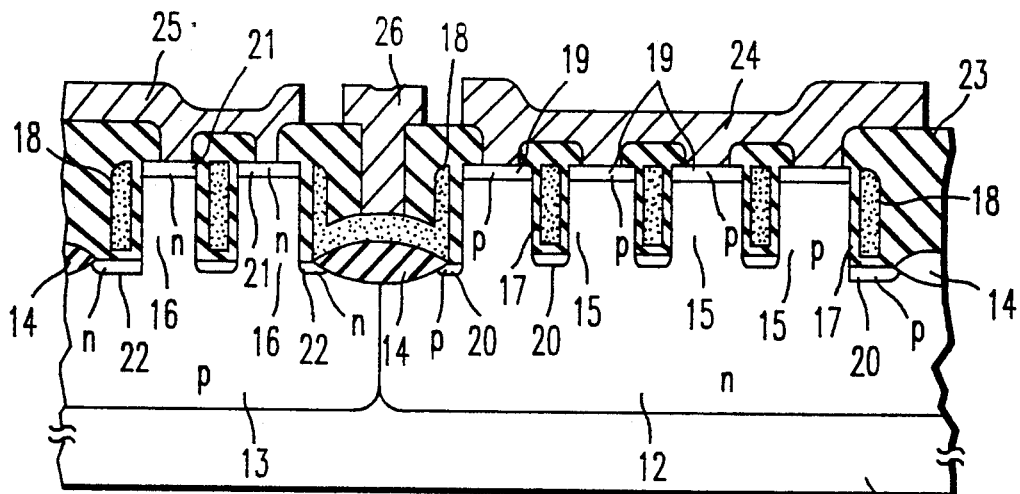
Figure 29B:
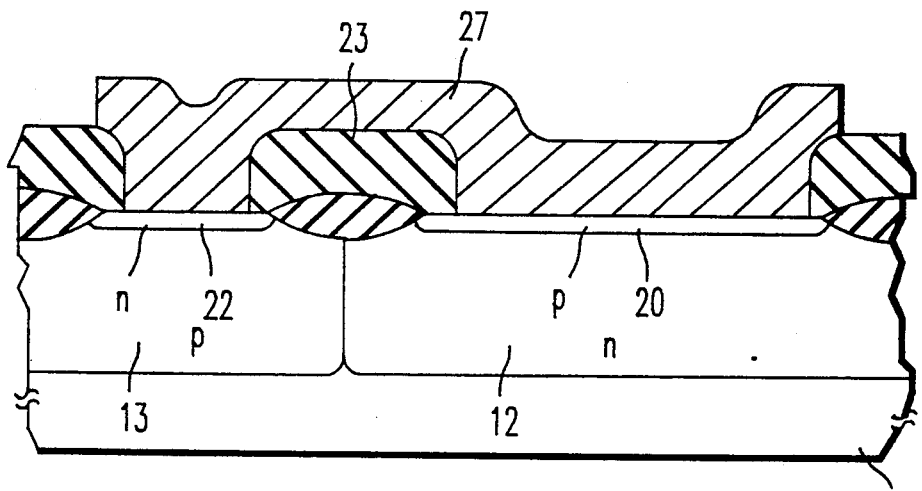
Figure 29C:
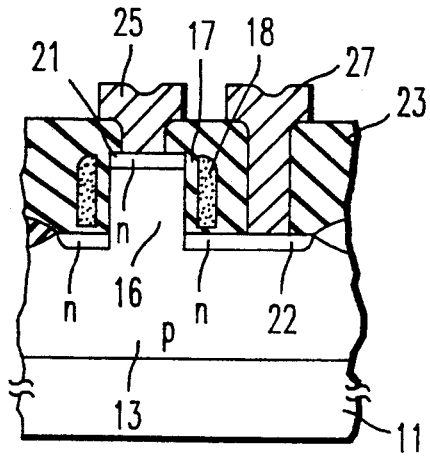
Figure 29D:
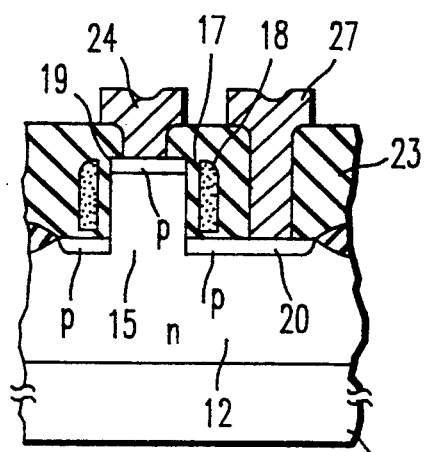

FIG. 24 is a plan view illustrating an SRAM of this invention, and FIG. 25 shows an equivalent circuit thereof. In FIG. 24, pillar layers 16a through 16f are formed in a trench 14 provided on a silicon substrate. MOS transistors $T_1$ and $T_2$, which serve transfer gates, are respectively formed using pillar layers 16a and 16b. The structures of the transistors $T_1$ and $T_2$ are basically the same as those of the MOS transistors in the seventh embodiment. Specifically, drain diffusion layers are formed on the upper surfaces of the pillar layers 16a and 16b. Source diffusion layers are formed at the bottom of the trench 14. A gate electrode 18a of polysilicon film is formed continuously so as to surround the pillar layers 16a and 16b. The gate electrode 18a constitutes a word line WL with respect to the MOS transistors $T_1$ and $T_2$.

A driver MOS transistor $T_3$ is constituted by the pillar layer $16c$. Another driver MOS transistor $T_4$ is constituted by the pillar layer $16f$. The MOS transistors $T_3$ and $T_4$ have substantially the same structures as those in the seventh embodiment. The gate electrode $18b$ of the MOS transistor $T_3$ extends to a pillar layer $16d$ that serves as a pedestal. At a portion on this pillar layer $16d$, a polysilicon film lead $35b$ is connected to the gate electrode $18b$. The drain layers of the MOS transistors $T_2$ and $T_4$ are connected to each other by way of the lead $35b$.

Similarly, the gate electrode $18c$ of the MOS transistor $T_4$ extends to a pillar layer $16e$ that serves as a pedestal. At a portion on this pillar layer $16e$, a polysilicon film lead $35a$ is connected to the gate electrode $18c$. The drain regions of the MOS transistors $T_1$ and $T_3$ are connected to each other by way of the lead $35a$. The leads $35a$ and $35b$ are connected to a power supply (Vcc) lead $35c$ respectively interposing high-resistance polysilicon films $36a$ and $36b$ (load resistors), as shown in FIG. 24. In FIG. 24, a data lead D $37a$, a data lead D $37b$ and a ground (Vss) lead $37c$ are shown with their intermediate portions omitted. These leads $37a$, $37b$ and $37c$ are all made of Al film. The leads $37a$ and $37b$ are respectively connected to the source diffusion layers of the MOS transistors $T_1$ and $T_2$ at contact portions $38a$ and $38b$. The ground lead $37c$ is connected to the common source diffusion layers of the MOS transistors $T_3$ and $T_4$ at a contact portion $38c$. In FIG. 24, regions $39a$, $39b$ and $39c$, which are respectively encircled by dot-and-dash lines, represent element regions.

Figure 26:
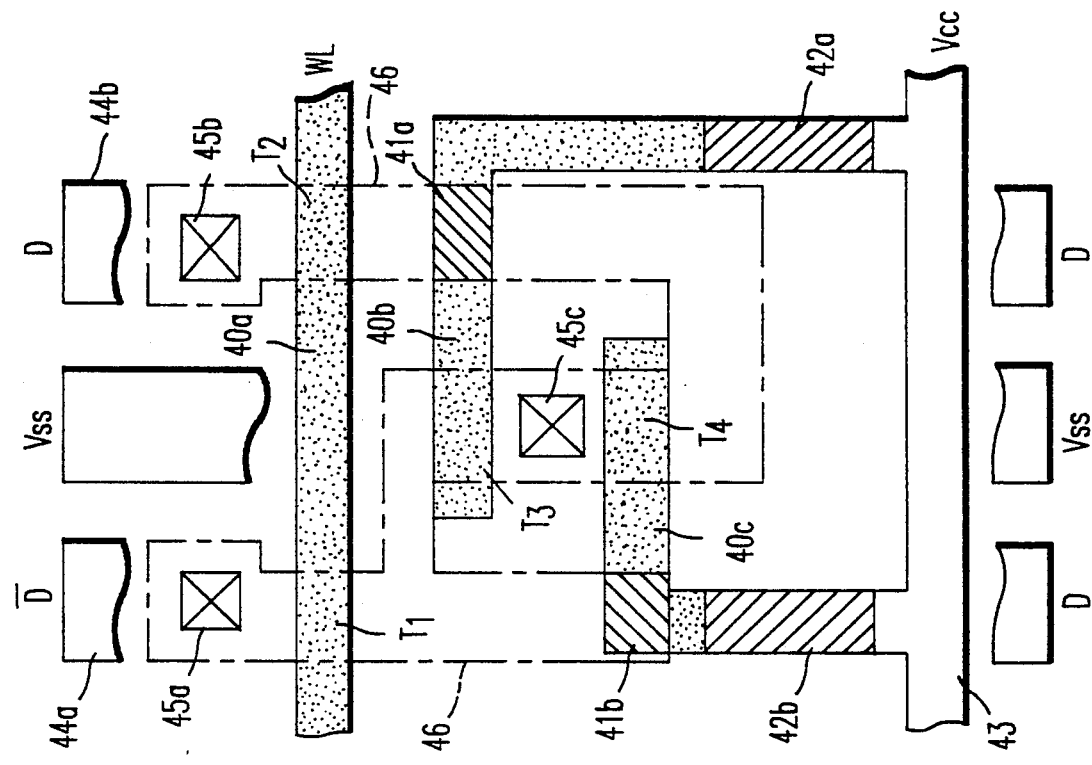
FIG. 26 is a plan view illustrating a conventional CMOS inverter circuit to be compared with the eighth embodiment according to the present invention.

FIG. 26 is a plan view illustrating a conventional SRAM for the sake of comparison. In FIG. 26, a gate electrode $40a$ of MOS transistors $T_1$ and $T_2$, which serve as transfer gates, is continuously formed to constitute a word line (WL). A gate electrode $40b$ of a driver MOS transistor $T_3$ is directly connected to a diffusion layer of the MOS transistor $T_2$. This connection is made at a shaded portion $41a$, which is connected to a Vcc lead 43 through a high-resistance polysilicon film $42a$ (load). A gate electrode $40c$ of a driver MOS transistor $T_4$ is directly connected to a diffusion layer of the MOS transistor $T_1$. This connection is made at a shaded portion $41b$, which is connected to the Vcc lead 43 through a high-resistance polysilicon film $42b$ (load). Data lines $44a$ and $44b$ are respectively connected to diffusion layers of the MOS transistors $T_1$ and $T_2$ at contact portions $45a$ and $45b$. A ground lead Vss $44c$ is connected to a common source diffusion layer of the MOS transistors $T_3$ and $T_4$ at a contact portion $45c$. In FIG. 26, a region 46 encircled by a dot-and-dash line represents an element region.

In the case of SRAMs, a large current-carrying capacity is not required as compared to DRAMs. Thus, the reduction of the circuit area is not so advantageous as in the case of DRAMs. However, in the eighth embodiment of this invention, the driver MOS transistors of the SRAM are constituted by a plurality of small pillar layers. As a result, operation characteristics of the driver MOS transistors can be significantly improved.

In the eighth embodiment, the flip-flop driver MOS transistors have drain regions on the upper surfaces of the pillar layers. This is because the data signal leads can be connected easily and securely to the drain regions as compared to the drain regions formed at the bottom of the trench. However, this is not an indispensable condition in this invention. The upper surfaces of the pillar layers may also be used as source regions. In this case, the depletion layers in the pillar layers extend when inversion occurs, as shown in FIG. 27, which differs from the state shown in FIG. 27, which differs from the state shown in FIG. 23.

Specifically, as seen from FIG. 27, depletion layers 29 extend from drain regions which are formed at the bottom of the trench. The upper portion of the pillar layer 16 can be electrically isolated from the lower substrate region even when the pillar layer 16 is not completely depleted. Namely, a so-called floating state can be obtained. This can be easily achieved when parameters of the MOS transistor are determined as follows. Specifically, the impurity concentration of the pillar layer $16 = 3 \times 10^{16}/cm^3$, the gate width = 1 $\mu$m and the gate oxide film thickness = 120 Å. In the case of the MOS transistors $T_1$ and $T_2$ (serve as transfer gates), the drain and source regions perform either functions of each other. Thus, the depletion layers 29 extend in either manner as shown in FIG. 23 or in FIG. 27.

In the previous embodiments, each of respective MOS transistors is constituted by a single pillar layer. However, this invention is not limited to such a configuration. In the following embodiments, each of MOS transistors in the respective embodiments is constituted by a plurality of pillar layers. Thus, a large gate width can be obtained within a small chip area. As a result, a circuit area in which a large current-carrying capacity is required can be significantly reduced.

Figure 30:
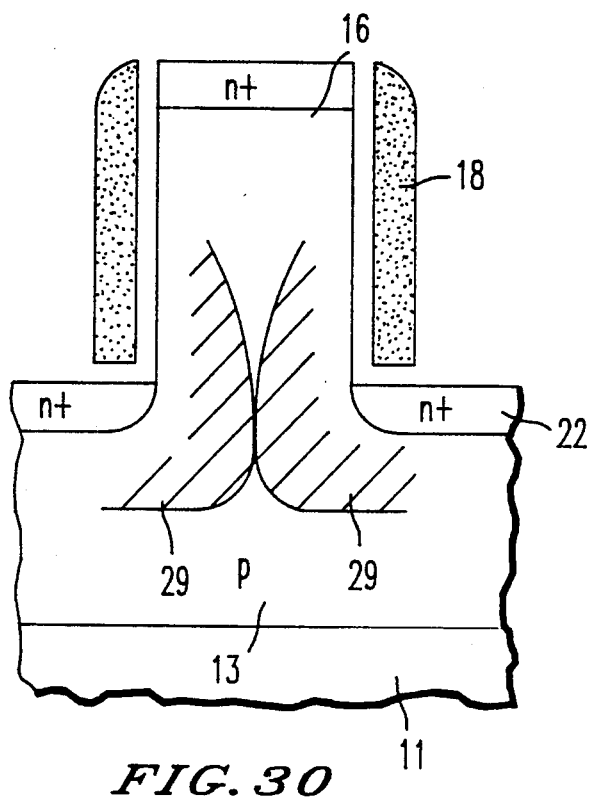
FIG. 30 is a schematic cross-sectional view for explaining the operation characteristics of the ninth embodiment according to the present invention.

Next, a ninth embodiment of this invention will be described with reference to FIGS. 28 through 30. FIG. 28a is a plan view illustrating a CMOS inverter circuit of the ninth embodiment according to the present invention, and FIG. 28b shows an equivalent circuit thereof. FIGS. 29a through 29d are cross-sectional views taken along lines A—A, B—B, C—C and D—D of FIG. 28a, respectively. An n-type well 12 and a p-type well 13 are formed on a silicon substrate 11. Silicon pillar layers 15 and 16, which are island-shaped projections, are formed in the n-type well 12 and the p-type well 13, respectively in a prescribed arrangement. Specifically, a plurality of pillar layers 15 are surrounded with a trench 14, and formed in an arrangement of two columns and four rows so as to constitute a MOS transistor Qp. Similarly, a plurality of pillar layers 16 are surrounded with the trench 14, and formed in an arrangement of two columns and two rows so as to constitute a MOS transistor Qn.

The MOS transistors Qp and Qn are fabricated in a vertical configuration having the inner circumferential surfaces of the respective pillar layers 15 and 16 as channel regions. Specifically, an element isolation oxide film is formed in the trench 14. A gate oxide film 17 is formed on the outer circumferential surfaces of the pillar layers 15 and 16. A gate electrode 18 of the MOS transistor Qp is formed as follows. Specifically, a p+-type polysilicon film is deposited in the trench 14. Thereafter, the polysilicon film is eliminated except that deposited on the portions immediately close to the outer circumferential surfaces of the pillar layers 15. This is performed by use of an anisotropic etching technique such as a resist-processing and a reactive ion etching (RIE). As a result, the gate electrode 18 of the MOS transistor Qp is obtained. A gate electrode 13 of the MOS transistor Qn is formed by depositing an n+-type polysilicon film in the trench 14.

Thereafter, the same process as in the case of the MOS transistor Qp is performed near the outer circumferential surfaces of the pillar layers 16. Thereafter, source regions 19 and drain regions 20 of the p-channel MOS transistor Qp are formed by ion-implanation of p-type impurities. Further, source regions 21 and drain regions 22 of the n-channel MOS transistor Qn are formed by ion-implantation of n-type impurities. Specifically, the source regions 19 and 21 are respectively formed on the upper surfaces of the pillar layers 15 and 16. Further, the drain regions 20 and 22 are respectively formed at the bottoms of the trench 14. The surface of the substrate on which the MOS transistors Qp and Qn have been formed is covered with a CVD oxide film 23. Next, Al films are formed filling in contact holes made in the oxide film 23. Thereafter, the Al films are patterned so as to form necessary terminal leads such as a Vcc lead 24, a Vss lead 25, an input terminal (Vin) lead 26 and an output terminal (Vout) lead 27.

In this embodiment, the parameters of the respective elements are determined as follows. Specifically, in the case of channel inversion, the respective pillar layers can be satisfactorily isolated from the lower portions thereof. FIG. 30 shows the inversion state of the p-channel MOS transistor Qp in more detail. In FIG. 30, two depletion layers 29 extend from the drain region 22 formed at the bottom of the trench 14 so as to approach to each other. When two depletion layers 29 come in contact with each other, the pillar layer 16 becomes a so-called floating state. Namely, the pillar layer 16 is electrically isolated from the lower substrate region. In order to satisfy the above-described condition, the impurity concentration of the p-type well 13 must be about $3 \times 10^{16}/cm^3$. Further, the width of the pillar layer 16 must be about 1 $\mu$m, and the thickness of the gate oxide film 8 must be about 120 Å. The same condition can be applied to the p-channel MOS transistor Qp of FIGS. 1a and 1b.

Next, the advantages of the inverter circuit according to this embodiment of the present invention will be described in comparison with the structure of a conventional inverter circuit. In this embodiment, the channel lengths of both the p-channel and n-channel MOS transistors Qp and Qn are substantially the same as the depth of the trench 14. Assume that the channel widths of the transistors Qp and Qn are required to be 38.4 $\mu$m and 19.2 $\mu$m, respectively. These requirements can be satisfied when each of the pillar layers 15 and 16 is determined to have a 1 $\mu$m-square section. Further, the numbers of the layers 15 and 16 are determined to be eight and four, respectively, as shown is FIG. 28a. In this case, a total area of the above-described pillar layers 15 and 16 becomes about $5.4 \times 12.3 = 66.4$ $\mu m^2$.

Figure 31:
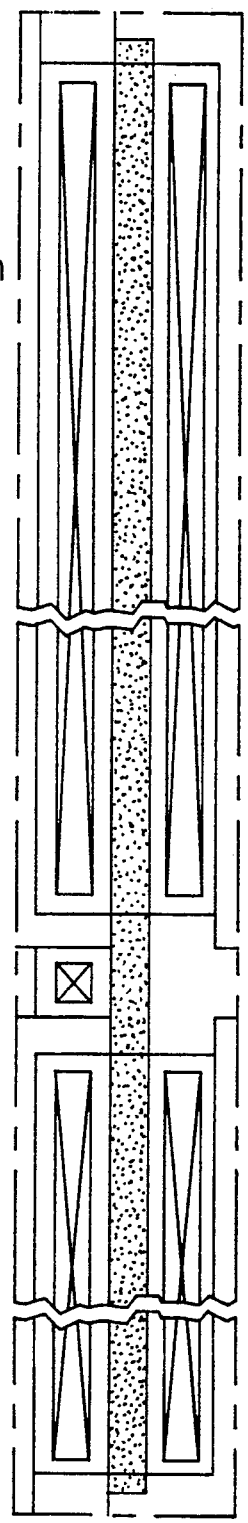
FIG. 31 is a plan view illustrating a conventional CMOS inverter circuit to be compared with the ninth embodiment according to the present invention.

FIG. 31 shows the conventional planar configuration of a CMOS inverter circuit for the sake of comparison. The circuit has the same current-carrying capacity as that of the CMOS inverter circuit according to this invention. In FIG. 31, the channel lengths of both the p-channel and n-channel MOS transistors are 0.5 $\mu$m. The channel widths of the p-channel and n-channel MOS transistors are 38.4 $\mu$m and 19.2 $\mu$m, respectively. In this case, a total area required to provide the circuit is about $3 \times 60.6 = 181.8$ $\mu m^2$.

As described above, in this embodiment, a prescribed circuit area in this embodiment, a prescribed circuit area in the device can be significantly reduced. However, in a circuit portion in which only a small current-carrying capacity is required, the major area of such a portion is occupied by the contact hole area. Further, in terms of the contact hole area, per se, there is no difference, between the devices of this invention and the conventional counterpart.

Thus, this invention is advantageous when it is applied to a circuit portion in which a large current-carrying capacity is required. For example, when this invention is applied to the peripheral circuits of DRAMs, the circuit area therein can be significantly reduced while maintaining their large current-carrying capacity. In the process of manufacturing DRAMs, memory cells are fabricated in a trench capacitor configuration. Here, assume that the CMOS inverter circuits, which are the peripheral circuits of a DRAM, are trenched in accordance with this invention while at the same time the memory cell regions of the DRAM are trenched. This can significantly enhance the productivity in the process of manufacturing DRAMs.

Figure 32:
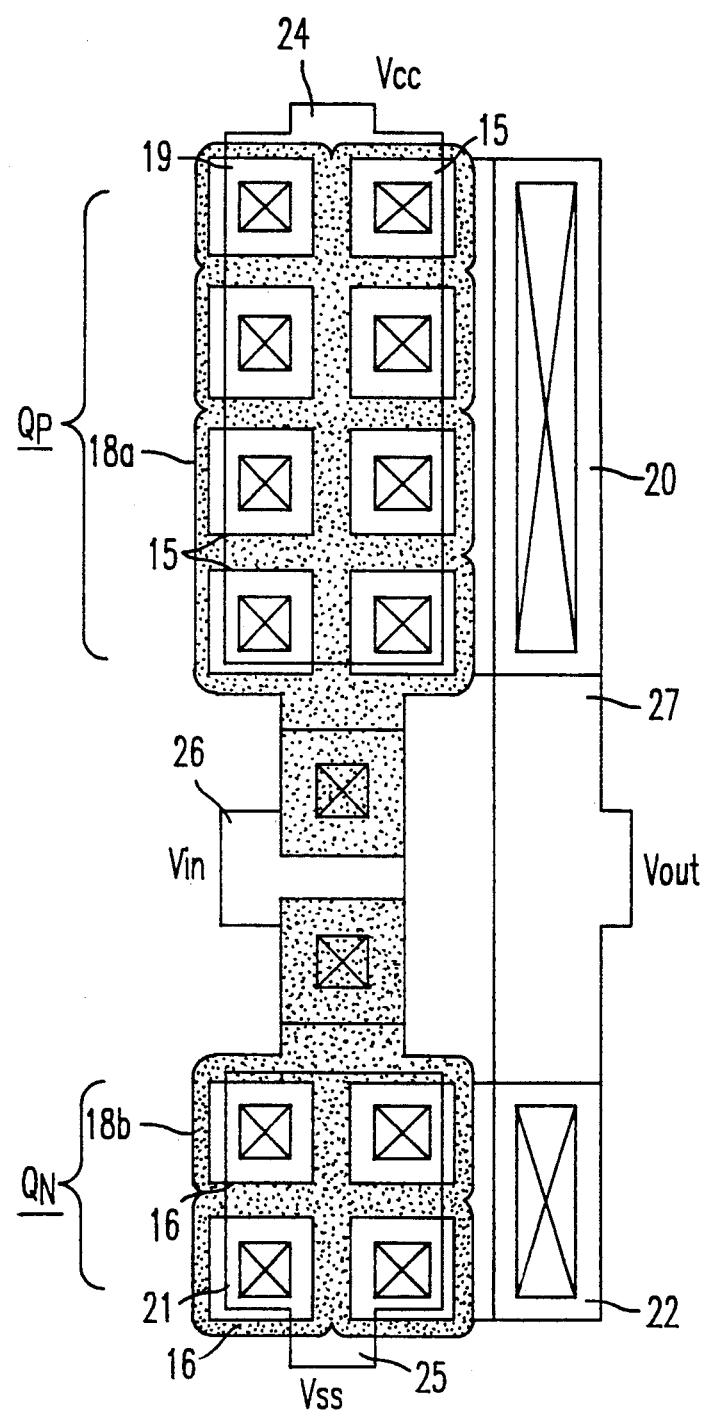
FIG. 32 is a plan view illustrating a tenth embodiment according to the present invention.

Next, a tenth embodiment of this invention will be described with reference to FIG. 32. In the ninth embodiment, the gate electrode 8 serves as both the gate electrodes of the n-channel MOS transistor and the p-channel MOS transistor. In FIG. 32, a gate electrode 18a of a p-channel transistor is electrically isolated from a gate electrode 18b of an n-channel transistor. The gate electrodes 18a and 18b are electrically connected by an input lead 26. This configuration slightly increases a circuit area. However, optimum characteristics of the respective transistors can be easily achieved.

Figure 33A:
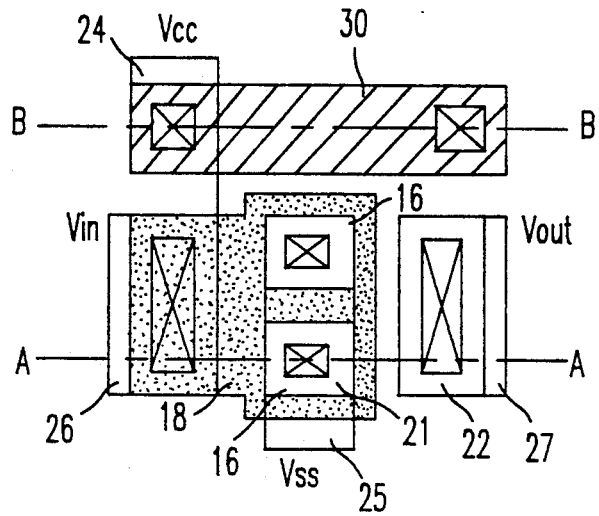
FIG. 33a is a plan view illustrating an eleventh embodiment according to the present invention.
Figure 33B:
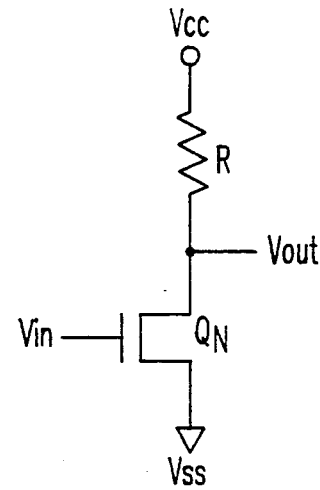
Figure 34A:
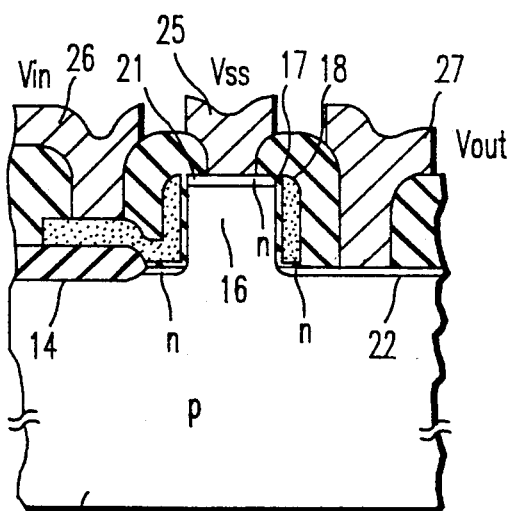
Figure 34B:
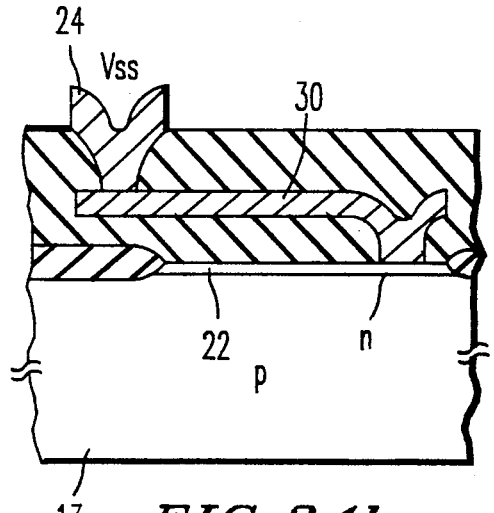

Next, an eleventh embodiment will be described with reference to FIGS. 33a, 33b, 34a, and 34b. FIG. 33a is a plan view illustrating an E/R-type inverter circuit, and FIG. 33b shows an equivalent circuit thereof. FIGS. 34a and 34b are cross-sectional views taken along line A—A and lone B—B of FIG. 33a, respectively. In FIGS. 33a and 34a, two pillar silicon layer 16 are formed on a p-type well 13. In the pillar layers 16, an E-type MOS transistor Qn (n-channel) is formed in the same manner as in the above-described embodiment. A resistor 30 of polysilicon film is formed as a load element of the transistor Qn. This simplified configuration is suitable for miniaturization of a circuit area.

Figure 35A:
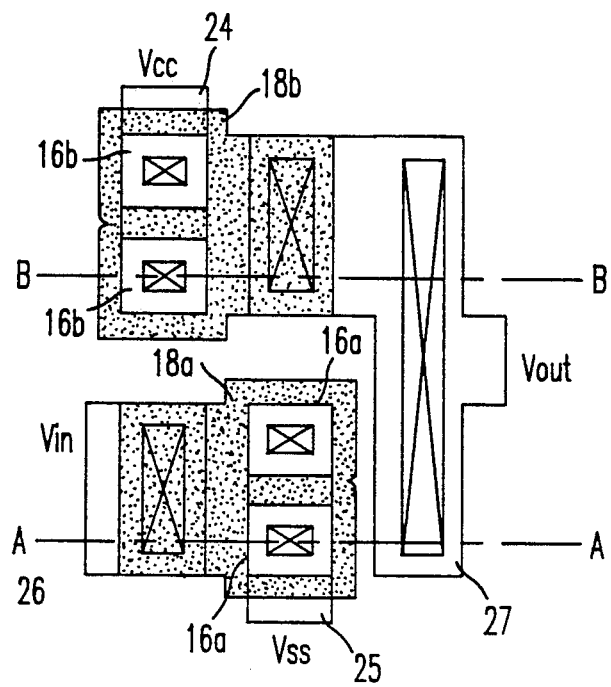
FIG. 35a is a plan view illustrating a twelfth embodiment according to the present invention.
Figure 35B:
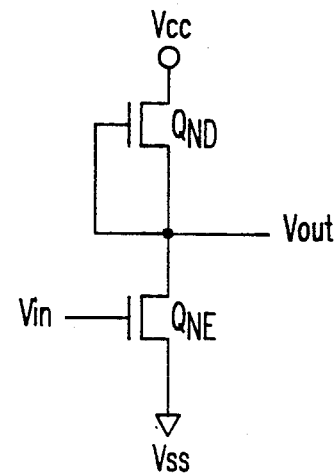
Figure 36A:
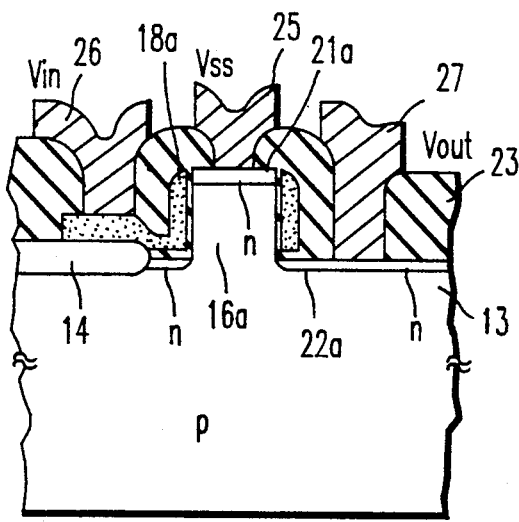
Figure 36B:
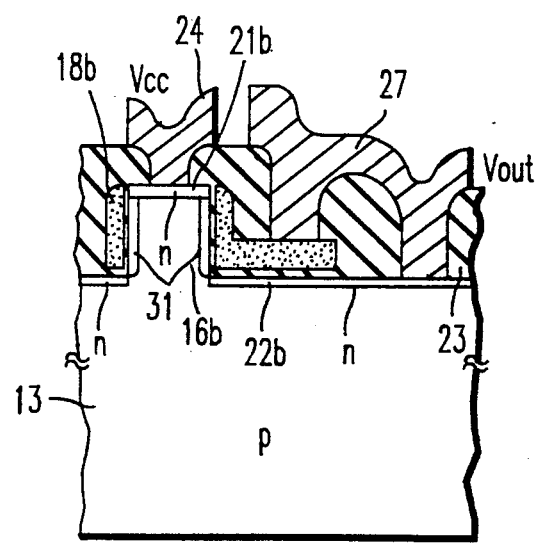

Next, a twelfth embodiment of this invention will be described with reference to FIGS. 35a, 35b, 36a and 36b. FIG. 35a is a plan view illustrating an E/D-type inverter, and FIG. 35b shows an equivalent circuit thereof. FIGS. 36a and 36b are cross-sectional views taken along lines A—A and lone B—B of FIG. 35a, respectively. In this embodiment, two pillar layers 16a and two pillar layers 16b are formed in a p-type well 13. An E-type MOS transistor $Q_{NE}$ is formed in the pillar layers 16a, and a D-type MOS transistor $Q_{ND}$ is formed in the pillar layers 16a. The transistor $Q_{NE}$ serves as a driver, and the transistor $Q_{ND}$ serves as a load. In this case, an n-type layers 31 must be formed on the inner circumferential surfaces of the pillar layers 16b so as to constitute the transistor $Q_{ND}$.

Next, a thirteenth embodiment of this invention will be described with reference to FIGS. 37a, 37b, 38a and 38b.

Figures 37A, 37B:
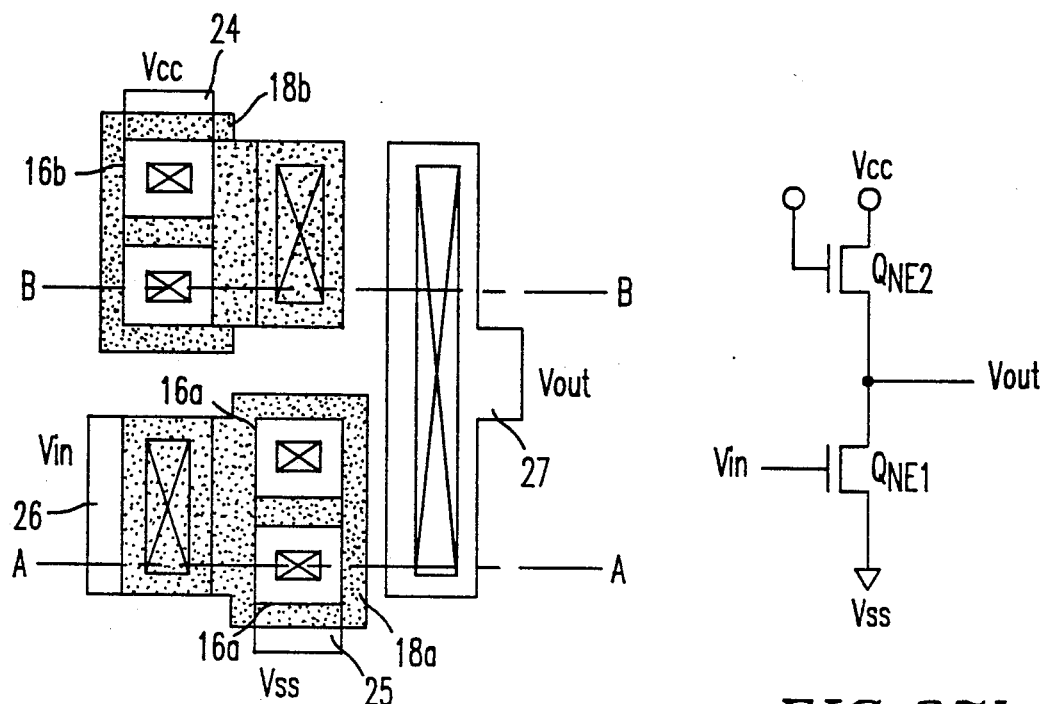
Figures 38A, 38B:
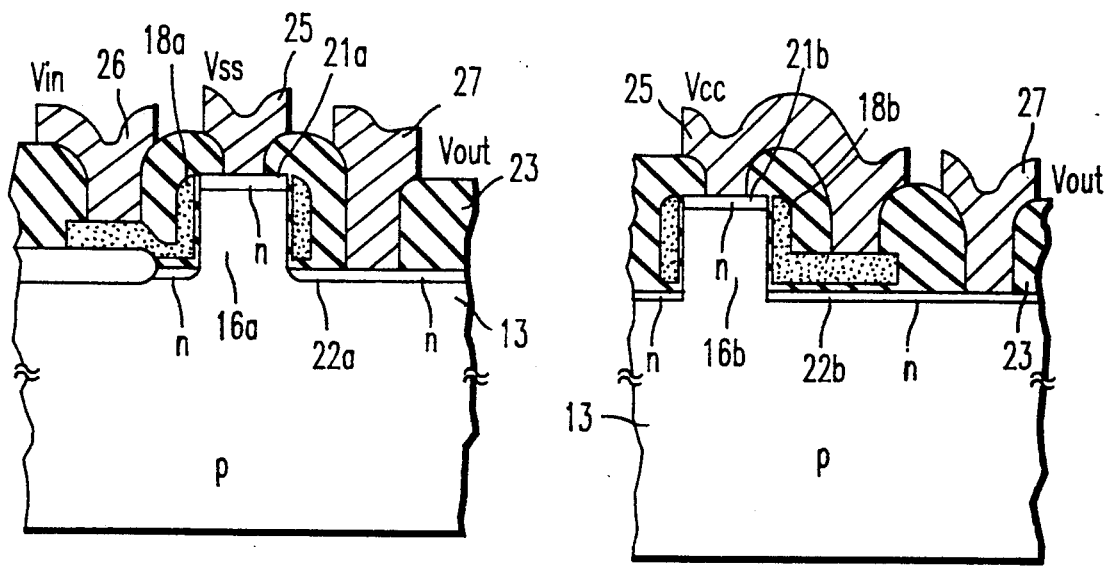

FIG. 37a is a plan view illustrating an E/E-type inverter circuit, and FIG. 37b is the equivalent circuit thereof. FIGS. 38a and 38b are cross-sectional views taken along line A—A and lone B—B of FIG. 37a, respectively. This embodiment differs from the above-described embodiment in that both a driver and a load are E-type MOS transistors $Q_{NE1}$ and $Q_{NE2}$. Further, the gate of the transistor $Q_{NE2}$ (the load) is connected to a Vcc lead 24.

Next, a fourteenth embodiment of this invention will be described with reference to FIGS. 39a, 39b, 40a and 40b. FIG. 39a is a plan view illustrating a dynamic-type inverter circuit and FIG. 39b shows an equivalent circuit thereof. FIGS. 40a and 40b are cross-sectional views taken along lines A—A and lone B—B of FIG. 39a, respectively. In this embodiment, the gate of a transistor $Q_{NE2}$ of FIG. 39b is connected to a lead 32 of FIG. 40b. The lead 32 is electrically isolated from a lead 16 of FIG. 40a. The gate of the transistor $Q_{NE2}$ receives a signal $\phi_B$, which is obtained by inverting and amplifying an input signal Vin.

As described above, in accordance with this invention, the E/R-type inverter, the E/D-type inverter, the E/E-type inverter and the dynamic-type inverter are respectively constituted by an n-channel MOS transistor alone. Thus, the well-isolating region between the p-type and n-type wells is not required. As a result, the process of manufacturing the devices can be simplified, and the circuit area in the device can also be significantly reduced. These inverters can also be constituted by using only a p-channel MOS transistor instead of an n-channel MOS transistor alone. Further, in these inverters, the gate electrodes surround the outer circumferences of the pillar layers completely. However, this invention can also be applied to the case when such complete surroundings are not formed.

Moreover, this invention can also be applied to various circuits other than an inverter circuit. For example, a flip-flop circuit, which is a basic circuit of various ICs, can be improved when this invention is applied thereto.

Figure 41A:
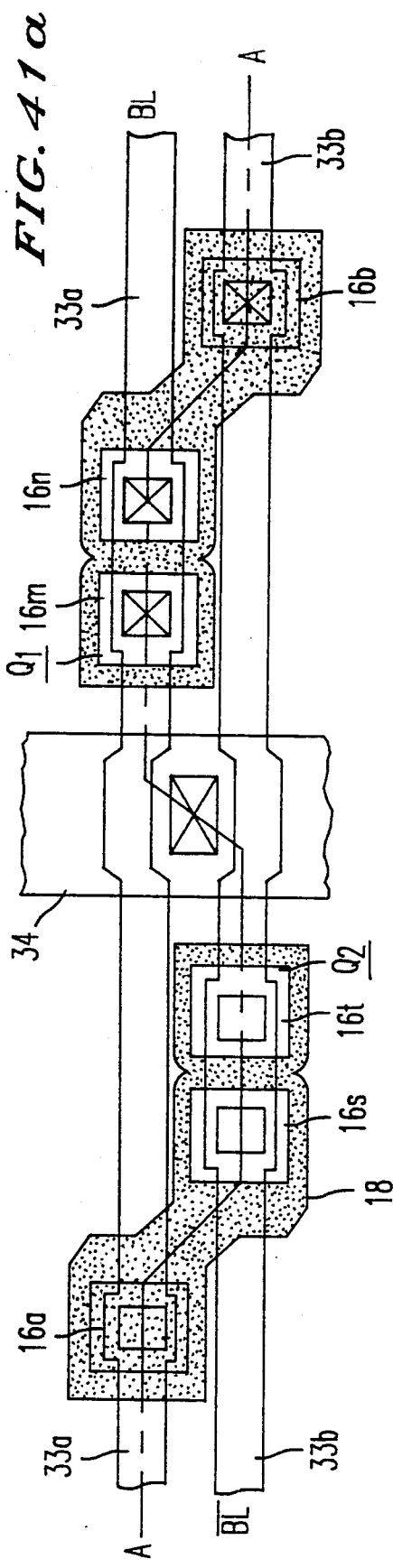
FIG. 41a is a plan view illustrating a fifteenth embodiment according to the present invention.
Figure 41B:
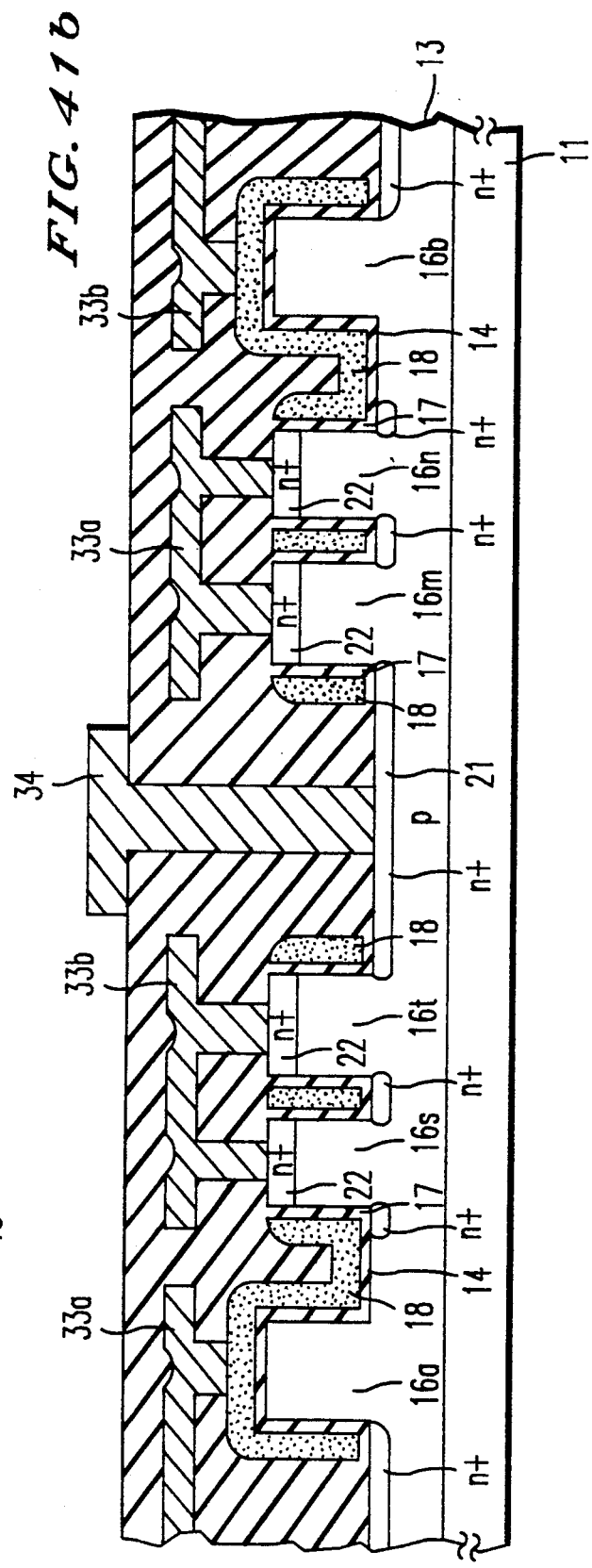
Figure 42:
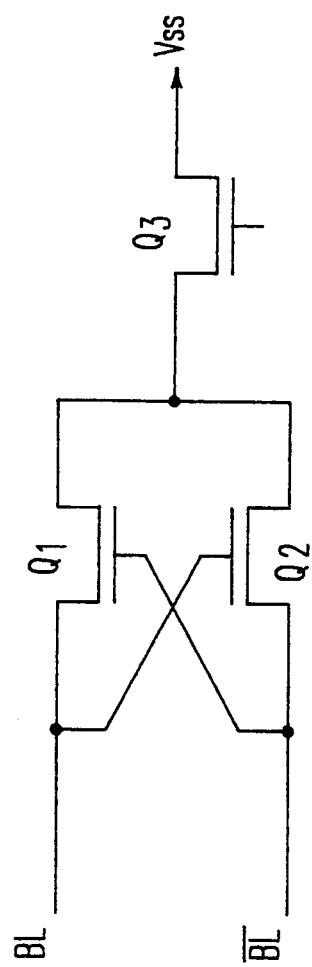

Next, a fifteenth embodiment of this invention will be described with reference to FIGS. 41a, 41b, 42 and 43. FIG. 41a is a plan view illustrating a flip-flop circuit according to the present invention, and FIG. 41b is a cross-sectional view taken along line A—A of FIG. 41a. FIG. 42 shows an equivalent circuit of the flip-flop circuit of FIGS. 41a and 41b. The flip-flop circuit is used for a bit-line sense-amplifier of DRAM. The flip-flop circuit comprises two n-channel MOS transistors $Q_1$ and $Q_2$. A p-type well 13 is formed on a silicon substrate 11. A plurality of pillar silicon layers 16 (16a, 16b, . . . ) are formed in the p-type well 13. These silicon layers 16a through 16b project so as to form islands surrounded with trench 14. The MOS transistor $Q_1$ is constituted by two pillar silicon layers 16m and 16n. The MOS transistor $Q_2$ is constituted by two pillar layers 16s and 16t.

Specifically, gate insulating films 17 are formed on the outer circumferential surfaces of the respective pillar layers 16m, 16n, 16s and 16t. Gate electrodes 18 of polysilicon film are formed in the trench 14 so as to surround the outer circumferential surfaces of the pillar layers 16m, 16n, 16s and 16t. On the upper surfaces of these pillar layers, n+-type diffusion layers 22 are formed as drain regions of the MOS transistors $Q_1$ and $Q_2$. In the trench 14, n+type diffusion layers 21 are formed as source regions of the MOS transistors $Q_1$ and $Q_2$. A pair of bit lines 33a and 33b of polysilicon films are formed so as to respectively contact the drain layers of the MOS transistors $Q_1$ and $Q_2$. The gate electrode 18 of the MOS transistor $Q_1$ is extended to the upper portion of the pillar layer 16b, and connected to the bit line 33b thereon, as shown in FIG. 41a. The gate electrode 18 of the MOS transistor $Q_2$ is extended to the upper portion of the pillar layers 16a, and connected to the bit line 33a thereon, as shown in FIG. 41a.

In this case, the pillar layers 16a and 16b are not provided to form the MOS transistors, but as pedestals that achieve secure connection between the bit lines and the gate electrodes. Specifically, the gate electrodes 18 and the drain regions 22 can be formed at substantially the same level. As a result, the depths of the holes through which the drain regions and the gate electrodes are connected to the bit lines can be determined uniformely. The source regions 21 formed at the bottom of the trench 14 are common source nodes to which an Al lead 34 is connected, as shown in FIG. 41b. Further, the common source nodes 21 are connected to a ground potential lead Vss interposing a MOS transistor $Q_3$ therebetween for activation, as shown in the equivalent circuit of FIG. 42.

Moreover, p-channel MOS transistors can also be formed along the same bit lines so as to constitute a PMOS sense-amplifier of the same configuration as described above.

In this embodiment, the circuit chip area can be significantly reduced as compared to a conventional planar configuration. Further, the subthreshold characteristics of the MOS transistors are steeper than those of the conventional counterpart. Thus, the signal delay at the gate electrodes can be reduced. As a result, the device can be operated at a high speed.

Figure 43:
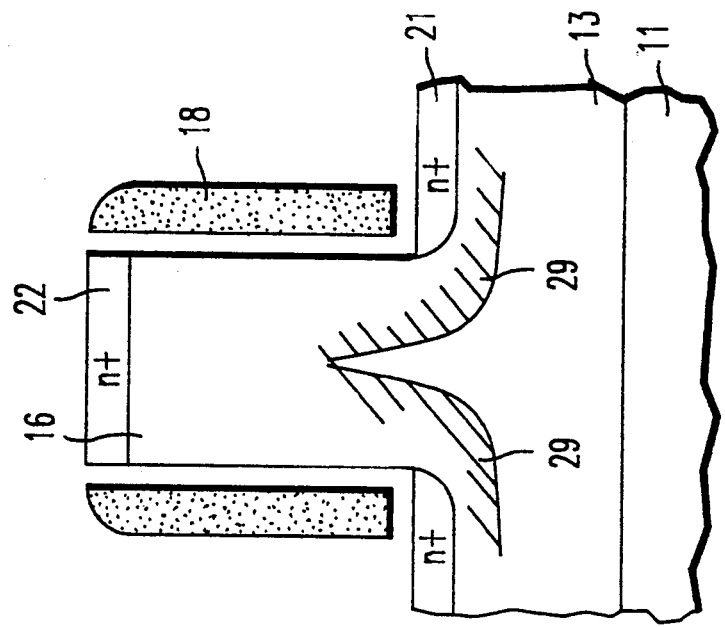
FIG. 43 is a schematic cross-sectional view for explaining the operation characteristics of the fifteenth embodiment according to the present invention.

FIG. 43 is a schematic diagram for explaining the operations of the MOS transistor according to this embodiment. In operation, two depletion layers 29 extend toward the center portion of the pillar layers 16, as shown in FIG. 43. Assume that the sizes of the pillar layers 16 are reduced to about minimum processable sizes. Further, the impurity-concentration of the pillar layers 16 are appropriately determined. As a result, the pillar layers 16 can be easily depleted toward the center portion when a voltage is applied to the gate electrode. Thus, the resistance between the drain region 22 and the source region 21 becomes sufficiently greater. Therefore, the flip-flop operation, which is strongly resistant to the substrate noise, can be obtained. Further, the gate of this MOS transistor has a strong controllability with respect to its channel. This is because the gate electrode 18 surrounds the channel between the drain region 22 and the source region 21, as shown in FIG. 43. As a result, satisfactory flip-flop operation characteristics can be obtained.

Next, a sixteenth embodiment of this invention will be described with reference to FIGS. 44 and 45. In general, a typical SRAM has memory cells constituted by flip-flop circuits of MOS transistors. In this embodiment, the flip-flop circuits can also be fabricated in a vertical configuration using a plurality of pillar layers in the same manner as that in the ninth embodiment.

Figure 44:
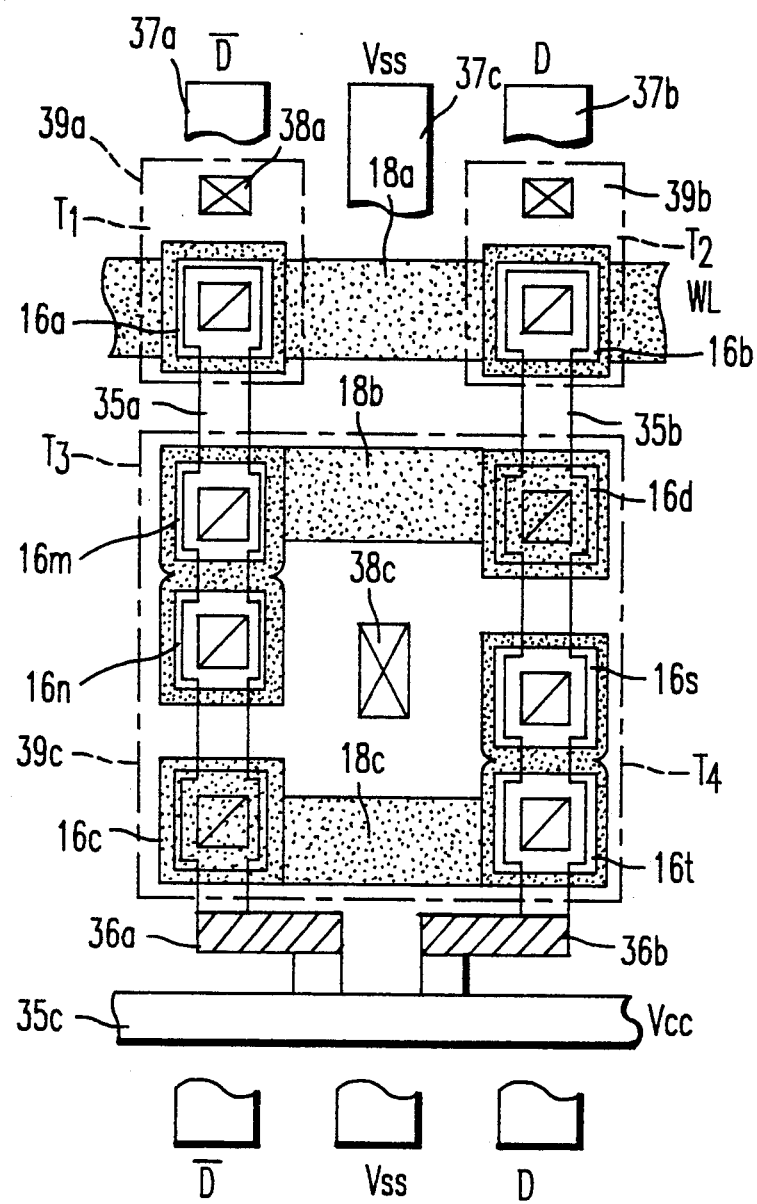
FIG. 44 is a plan view illustrating a sixteenth embodiment according to the present invention.
Figure 45:
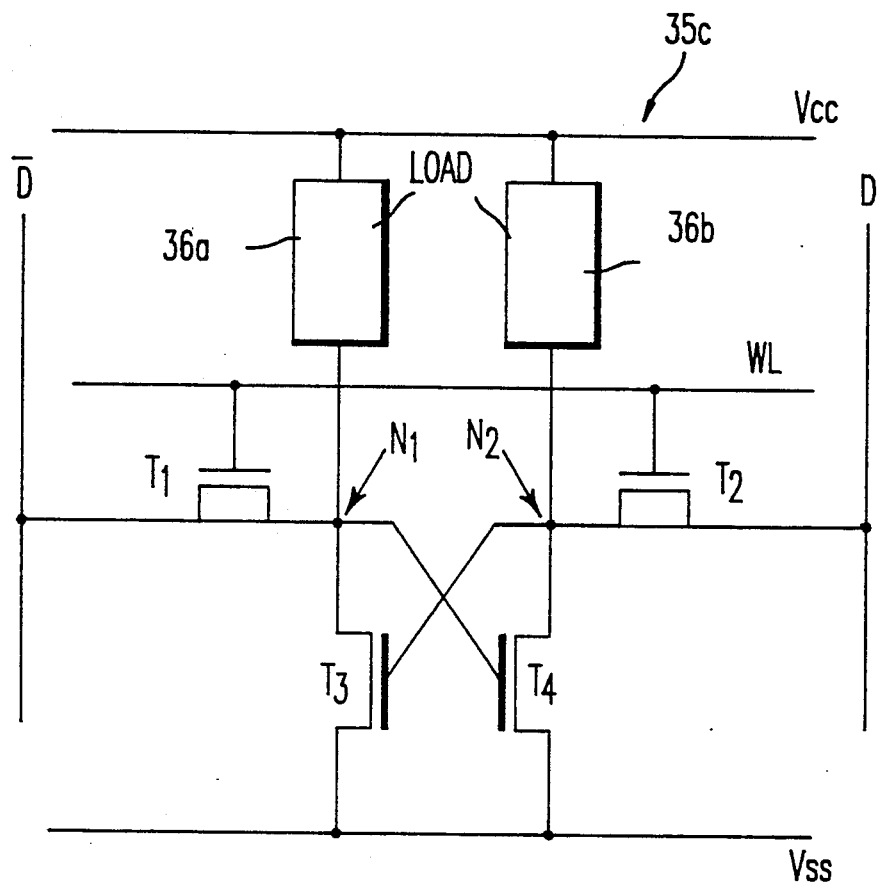
FIG. 45 is a diagram illustrating an equivalent circuit of FIG. 44.

Specifically, FIG. 44 is a plan view illustrating an SRAM cell portion, and FIG. 45 shows an equivalent circuit thereof. In FIG. 44, pillar layers 16 (16b, 16b . . . ) are formed in a silicon substrate. Transfer gate MOS transistors $T_1$ and $T_2$ are respectively formed using pillar layers 16a and 16b. The structures of the transistors $T_1$ and $T_2$ are basically the same as those of the MOS transistors in the ninth embodiment. Specifically, drain diffusion layers are formed on the upper surfaces of the pillar layers 16a and 16b. Source diffusion layers are formed at the bottom of trench 14 provided in the silicon substrate. A gate electrode 18a of polysilicon film is formed continuously so as to surround the pillar layers 16a and 16b. The gate electrode 18a constituted a word line WL with respect to the MOS transistors $T_1$ and T$_2$. A driver MOS transistor T$_3$ is constituted by pillar layers 16m and 16n.

Another driver MOS transistor T$_4$ is constituted by pillar layers 16s and 16t. The MOS transistors T$_3$ and T$_4$ have substantially the same structures as those in the ninth embodiments. The gate electrode 18b of the MOS transistor T$_3$ extends to a pillar layer 16b that serves as a pedestal. At a portion on this pillar layer 16b, a polysilicon film lead 35b is connected to the gate electrode 18b. The drain layers of the MOS transistors T$_2$ and T$_4$ are connected to each other by way of the lead 35b. Similarly, the gate electrode 18c of the MOS transistor T$_4$ extends to a pillar layer 16c that serves as a pedestal. At a portion on this pillar layer 16c, a polysilicon film lead 35a is connected to the gate electrode 18c. The drain regions of the MOS transistors T$_1$ and T$_3$ are connected to each other by way of the lead 35a. The leads 35a and 35b are connected to a power supply (Vcc) lead 35c interposing high-resistance polysilicon films 36a and 36b (load resistors), respectively, as shown in FIG. 45.

In FIG. 44, a data leads D 37a, a date lead D 37b and a ground (Vss) 37c are shown with their intermediate portions omitted. These leads 37a, 37b and 37c are all made of Al films. The leads 37a and 37b are respectively connected to the source diffusion layers of the MOS transistors T$_1$ and T$_2$ at contact portions 38a and 38b. The ground lead 37c is connected to the common source diffusion layers of the MOS transistors T$_3$ and T$_4$ at a contact portion 38c. In FIG. 44, regions 39a, 39b and 39c. Which are respectively encircled by dot-and-dash lines, represent element regions.

In the case of SRAMs, a large current-carrying capacity is not required as compared to DRAMs. Thus, the reduction of the circuit area is not so advantageous as that in the case of DRAMs. However, in this embodiment, the driver MOS transistors of the SRAM are constituted by a plurality of small pillar layers. As a result, operation characteristics of the driver MOS transistor can be significantly improved.

In this embodiment, the high-resistance polysilicon films are used as load resistors of the SRAM. However, this invention can be applied to various SRAMs other than this, for example, SRAMs using a complete CMOS-type flip-flop circuit, an E/E -type flip-flop circuit or an E/D type-flop circuit.

Figure 46A:
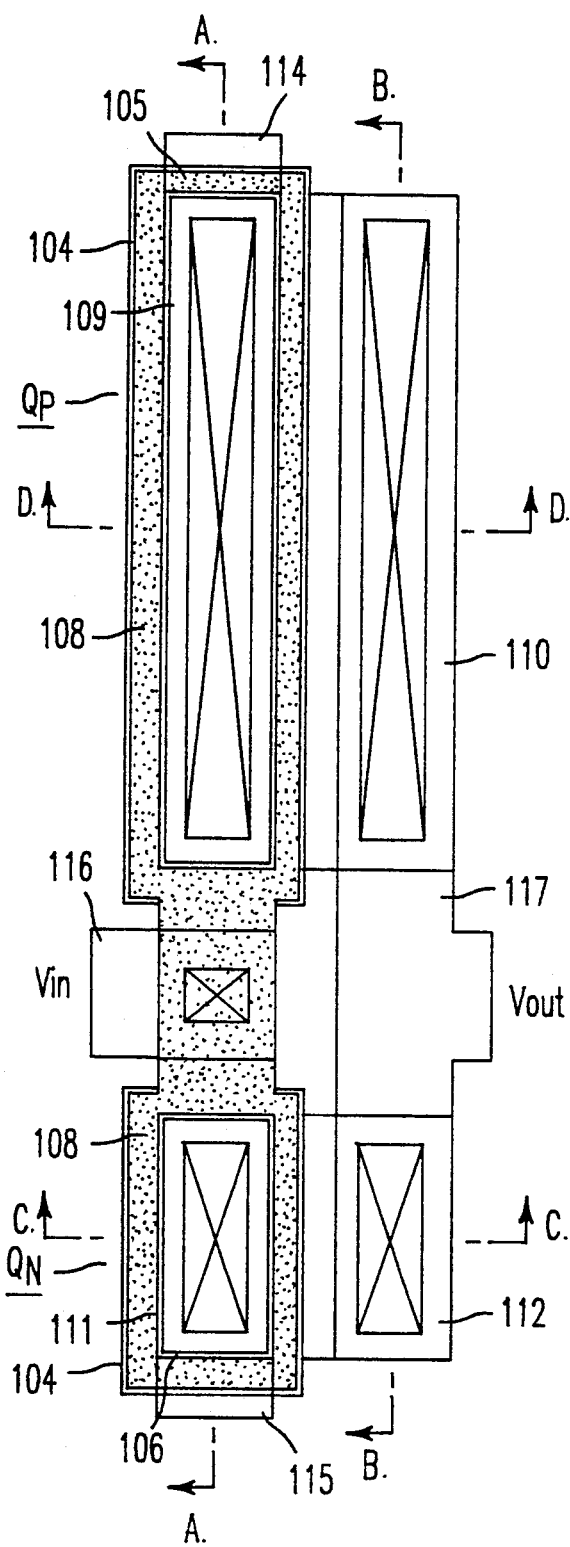
FIG. 46a is a plan view illustrating a seventh embodiment according to the present invention.
Figure 46B:
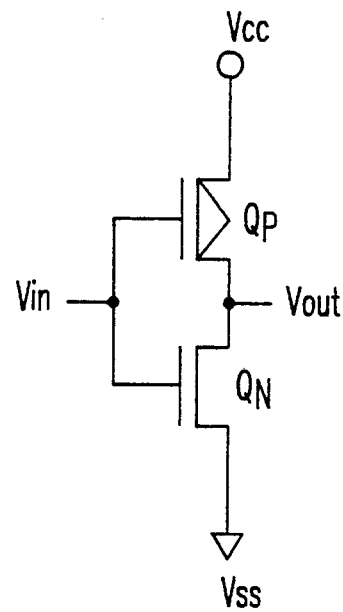
Figure 47A:
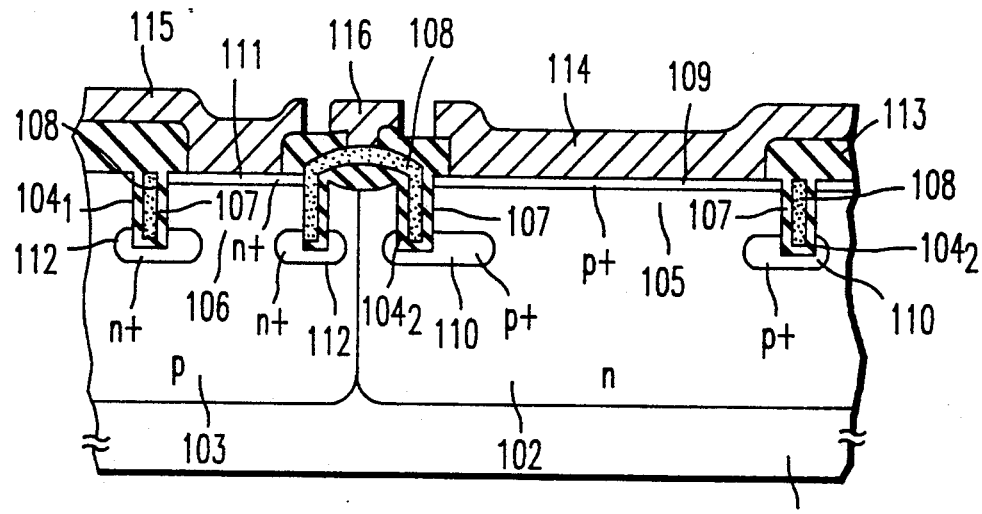
Figure 47B:
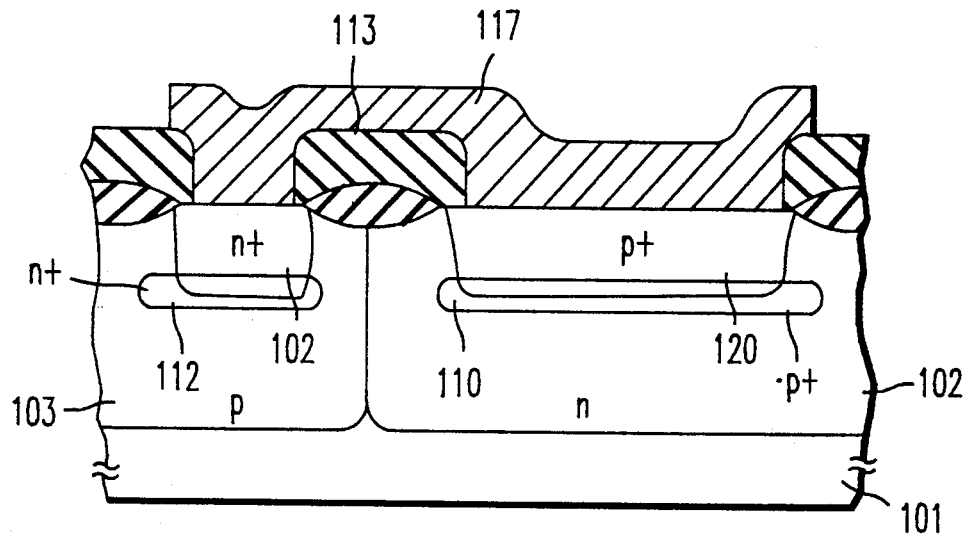
Figure 47C:
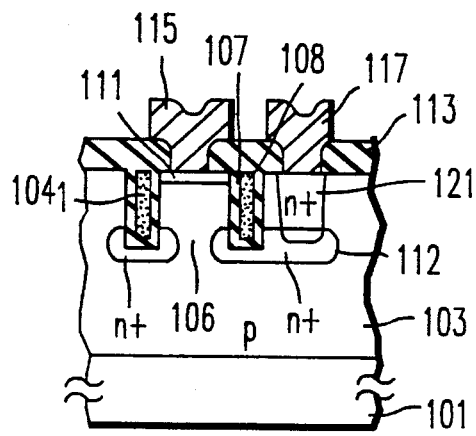
Figure 47D:
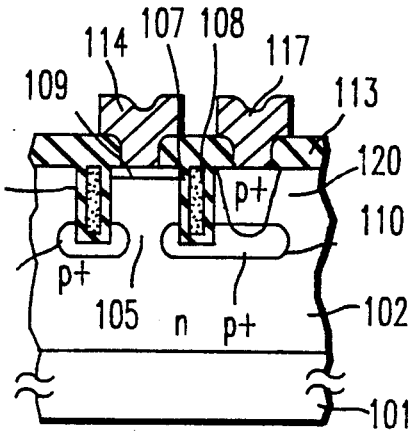

FIG. 46a is a plan view illustrating a CMOS inverter circuit of a seventeenth embodiment according to the present invention, and FIG. 46b shows an equivalent circuit thereof. FIGS. 47a through 47d are cross-sectional views taken along lines A—A, B—B, C—C and D—D of FIG. 46, respectively. An n-type well 102 and a p-type well 103 are formed on a silicon substrate 101. N-type silicon pillar layers 105 and 106 are formed being surrounded with a trench 104 (104$_1$, 104$_2$) in the n-type well 102 and the p-type well 103, respectively. A p-channel MOS transistor Qp and an n-channel MOS transistor Qn are respectively formed in the pillar layers 105 and 106.

The MOS transistors Qp and Qn are formed in a vertical configuration having the inner circumferential surfaces of the respective pillar layers 105 and 106 as channel regions. Namely, gate oxide films 107 are formed on the outer circumferential surfaces of the piller layers 105 and 106. Gate electrodes 108 are buried in the trench 104 surrounding the circumferential surfaces of the piller layers 105 and 106. The gate electrodes 108 are formed as follows. A p$^+$ or n$^+$ type polysilicon film is deposited and remained in the trench 104 by use of an anisotropic etching technique such as a reactive ion etching.

Parts of gate electrodes 108 buried in each trenches are connected on the outer surface of the substrate. This connection is realized as follows. A resist pattern is remained only on the connection region at etching process for the polysilicon film, and the polysilicon film is remained.

A p$^+$ drain diffusion layer 110 is buried on the bottom of the trench 104$_2$ on the side of the n-type silicon layer 105. A n$^+$ drain diffusion layer 112 is buried on the bottom of the trench 104$_1$ on the side of the p-type silicon layer 106. Parts of these drain diffusion layers 110 and 112 are extended to the outer side of the trenchs 104. In FIG., the drain diffusion layers 110 and 112 are buried having the ring-shape pattern along the trenches 104, but may be formed to completely separate the silicon pillar layers 105 and 106 from the under regions. The drain diffusion layers 110 and 112 are drawn out on the surface of the substrate using p$^+$ and n$^+$ diffusion layers 120 and 121 diffused to the drain diffusion layers 110 and 112. A p$^+$ source diffusion layer 109 and a n$^+$ source diffusion layer 111 are respectively formed on top surfaces of the layers 105 and 106.

The buried drain diffusion layers 110 and 112 are formed by a collector burying process using in the bipolar transistor technology. An epitaxial growth layer is formed on the substrate after forming the buried drain diffusion layers 110 and 112 on the substrate. Thereafter, the trenches 104 are formed. The buried drain diffusion layers 110 and 112 can be formed using the high energy ion implantation as the another process. The source diffusion layers 109 and 111, and drain drawing diffusion layers 120 and 121 are formed after forming the gate electrodes.

The surface of the substrate on which the MOS transistors Qp and Qn have been formed is covered with a CVD oxide film 113. The contact holes are opened on the film 113. Thereafter, Al film is evaporated and patterned. A Vcc wiring 114 as the source electrode wiring contacted to the source diffusion layer 109 of the p-channel MOS transistor, a Vss wiring 115 as the source electrode wiring contacted to the source diffusion layer 111 of the n-channel MOS transistor Qn, input terminal (Vin) wirings connected to the gate electrodes of the both transistors, an output terminal (Vout) wiring provided respectively to the drain drawing diffusion layers 120 and 121 are formed.

Figure 48:
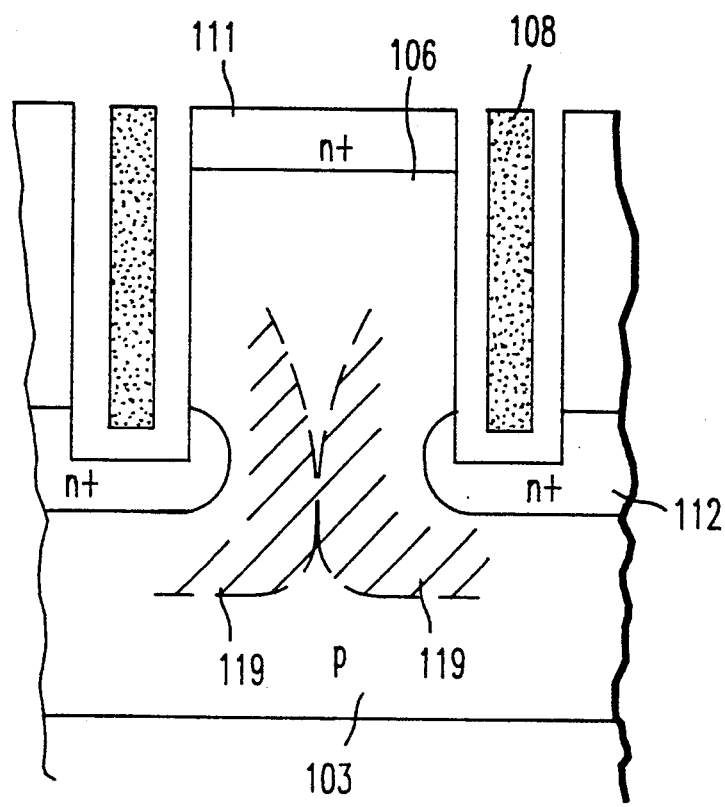
FIG. 48 is a schematic cross-sectional view for explaining the operation characteristics of the seventeenth embodiment according to the present invention.

Specifically, in the case of channel inversion, the respective pillar layers 105 and 106 can be satisfactorily isolated from the lower portions thereof. FIG. 48 shows the inversion state of the n-channel MOS transistor Qn in more detail.

In FIG. 48, two depletion layers 119 extend from the drain diffusion layer 112 formed at the bottom of the trench so as to approach to each other. When two depletion layers 119 come in contact with each other, the pillar layer 106 becomes a so-called floating state. Namely, the pillar layer 106 is electrically isolated from the lower substrate region. In order to satisfy the above-described condition, the impurity concentration of the p-type well 103 must by about $3 \times 10^{16}/cm^3$. Further, the width of the pillar layer 106 must be about 1 $\mu$m, and the thickness of the gate oxide film 108 must be about 120 Å. The same condition can be applied to the p-channel MOS transistor Qp.

Figures 49A, 49B:
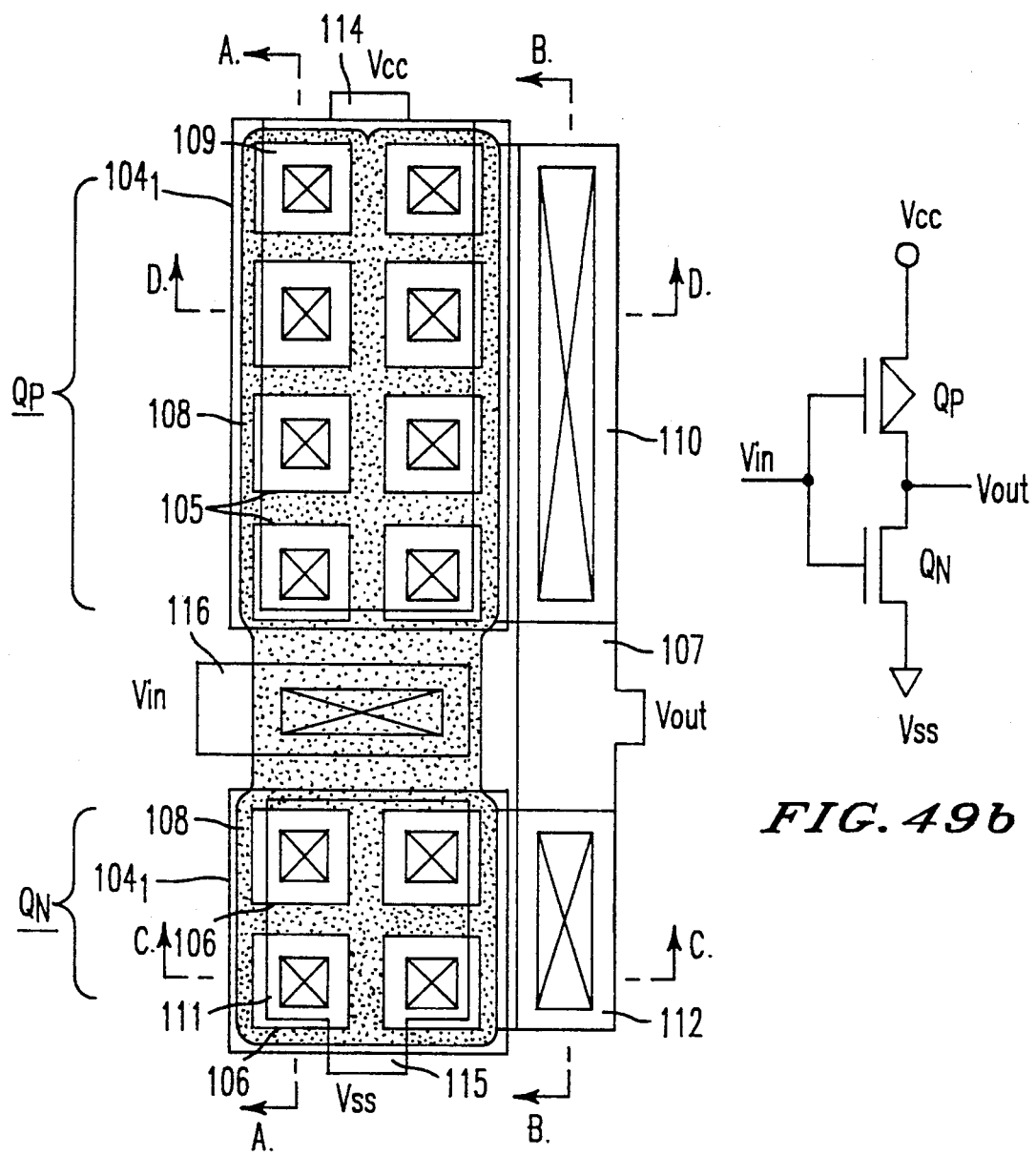
Figure 50A:
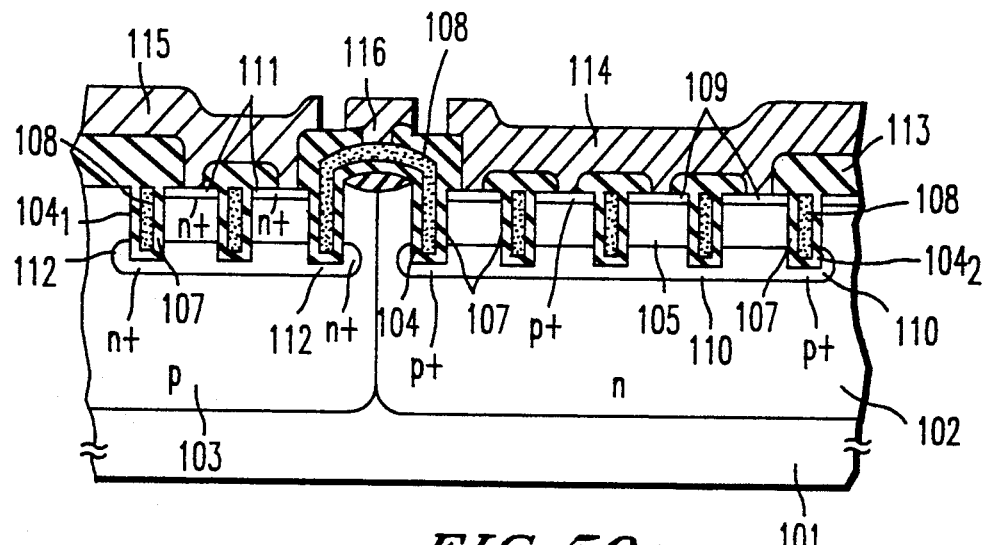
Figure 50B:
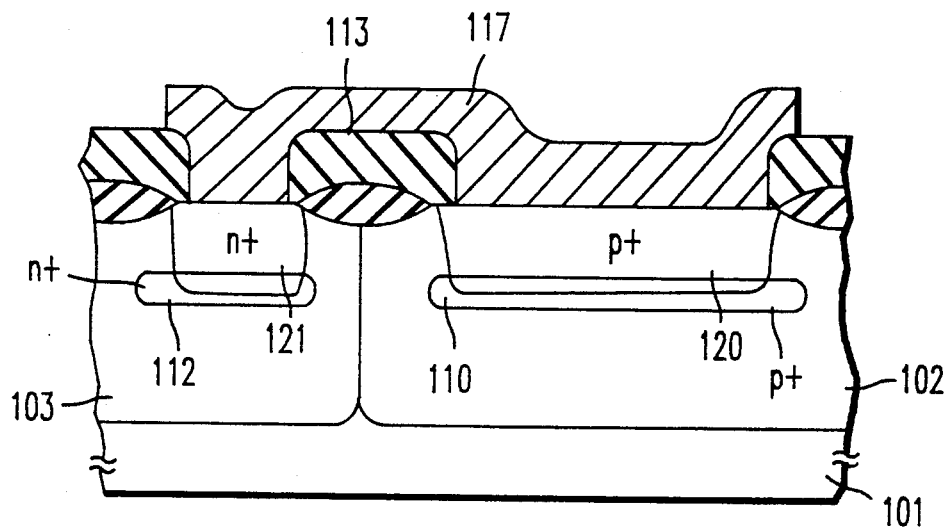
Figure 50C:
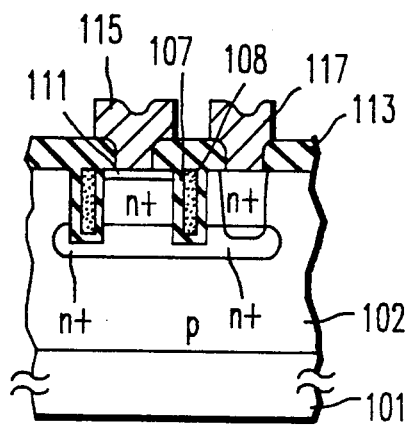
Figure 50D:
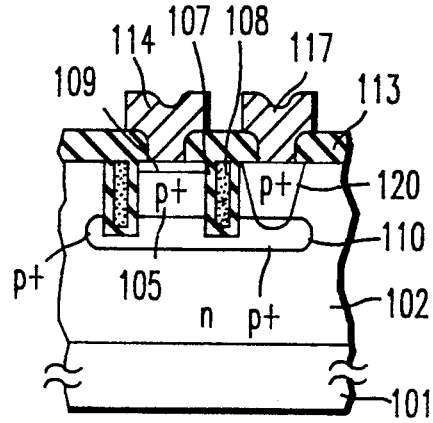

Next, an eighteenth embodiment of this invention will be described with reference to FIGS. 49 and 50. FIG. 49a is a plan view illustrating a CMOS inverter circuit, and FIG. 49b shows an equivalent circuit thereof. FIGS. 50a through 50d are cross-sectional views taken along lines A—A, B—B, C—C and D—D of FIG. 28a, respectively. In this embodiment, each transistors are formed using n-type pillar silicon layers 105 and p-type pillar silicon layers 106. A plurality of the silicon layers 105 are formed in the n-type well 102, and a plurality of the silicon layers 106 are formed in the p-type well 103. A plurality of the n-type pillar silicon layers 105 are surrounded by continuous trenches $104_1$, and a plurality of the p-type pillar silicon layers 106 are surrounded by continuous trenches $104_2$.

Figure 51A:
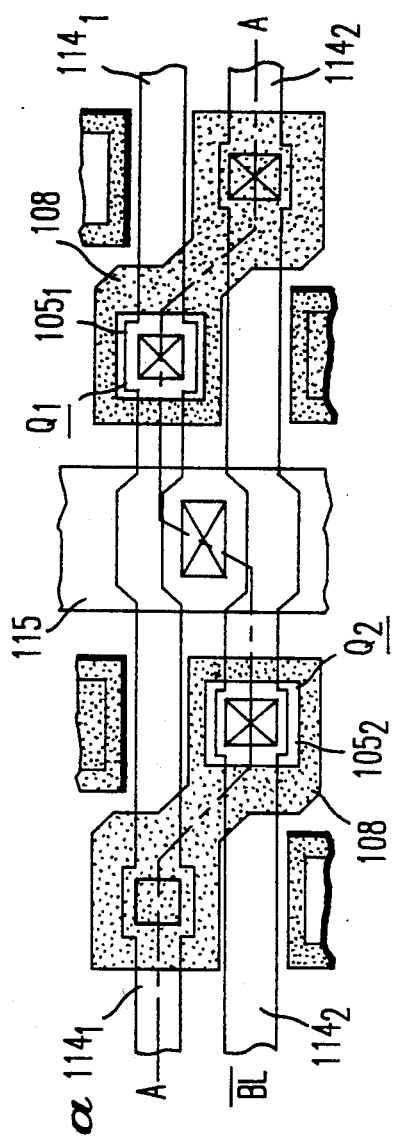
FIG. 51a is a plan view illustrating a nineteenth embodiment according to the present invention.
Figure 51B:
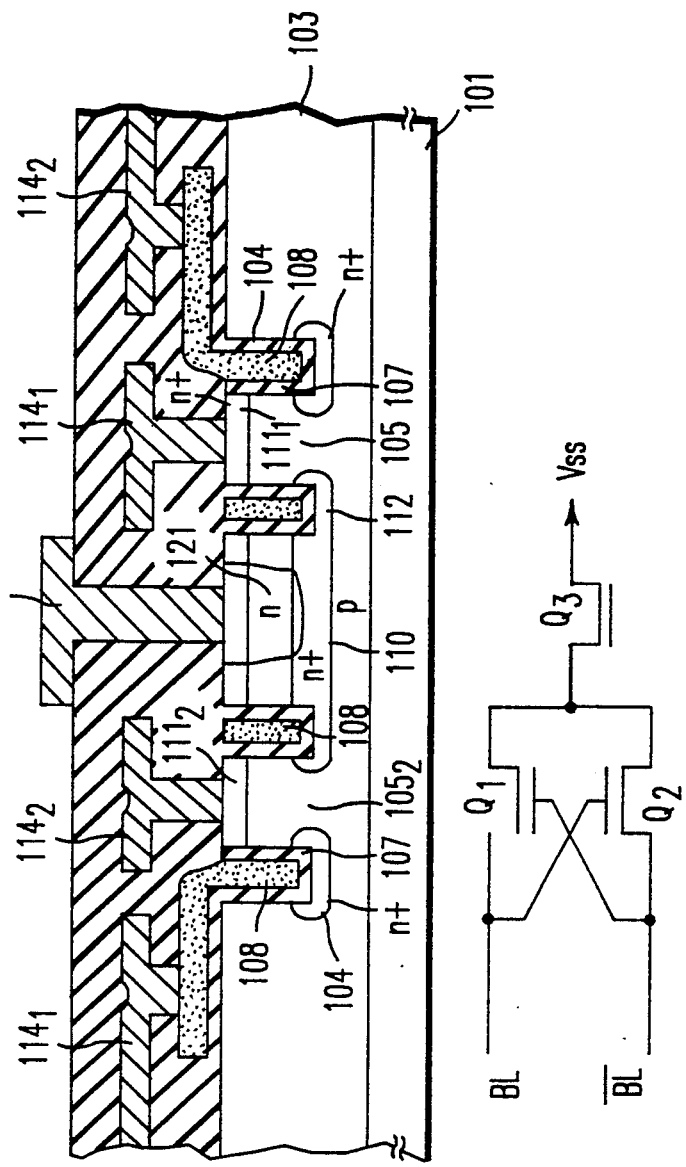
Figure 51C:
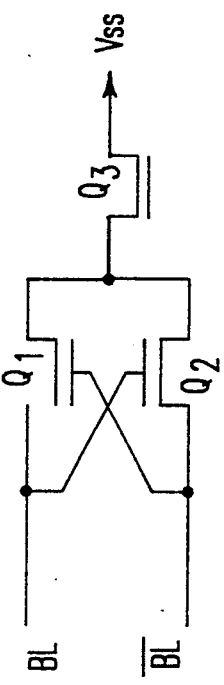

Next, a nineteenth embodiment of this invention will be described with reference to FIGS. 51a, 51b and 51c. FIG. 51a is a plan view illustrating a flip-flop circuit, FIG. 51b is a cross-sectional view taken along line A—A of FIG. 51a, FIG. 51c is an equivalent circuit. The flip-flop circuit is used for a bit-line sense-amplifier of a DRAM. The flip-flop circuit comprises two n-channel MOS transistors $Q_1$ and $Q_2$. A p-type well 103 is formed on a silicon substrate 101. A plurality of pillar silicon layers 105 ($105_1$, $105_2$, - - -) are formed surrounding by trenches 104 in the p-type well 103. The MOS transistor $Q_1$ is constituted by the pillar silicon layer $105_1$, and the MOS transistor $Q_2$ is constituted by the pillar silicon layer $105_2$. Buried drain diffusion layers 110 of two MOS transistors $Q_1$ and $Q_2$ are connected at the outer portion from the trenches. The common drain wirings 115 are connected to the diffusion layer 121. A wiring $114_1$ as a bit line BL is provided on the source diffusion layer $105_1$ of the transistor $Q_1$ and on the gate electrode 108 of the transistor $Q_2$ as the contacts. A wiring $114_2$ as another bit line BL is provided on the source diffusion layer $105_2$ of the transistor $Q_2$ and on the gate electrode 108 of the transistor $Q_1$ as the contacts.

Next, a twentieth embodiment of this invention will be described with reference to FIGS. 52 and 53. A typical SRAM (static random access memory) has memory cells constituted by flip-flop circuits of MOS transistors. In this embodiment, the flip-flop circuit can also be fabricated in a vertical configuration using a plurality of pillar layers in the same manner as that in the nineteenth embodiment.

Figure 52:
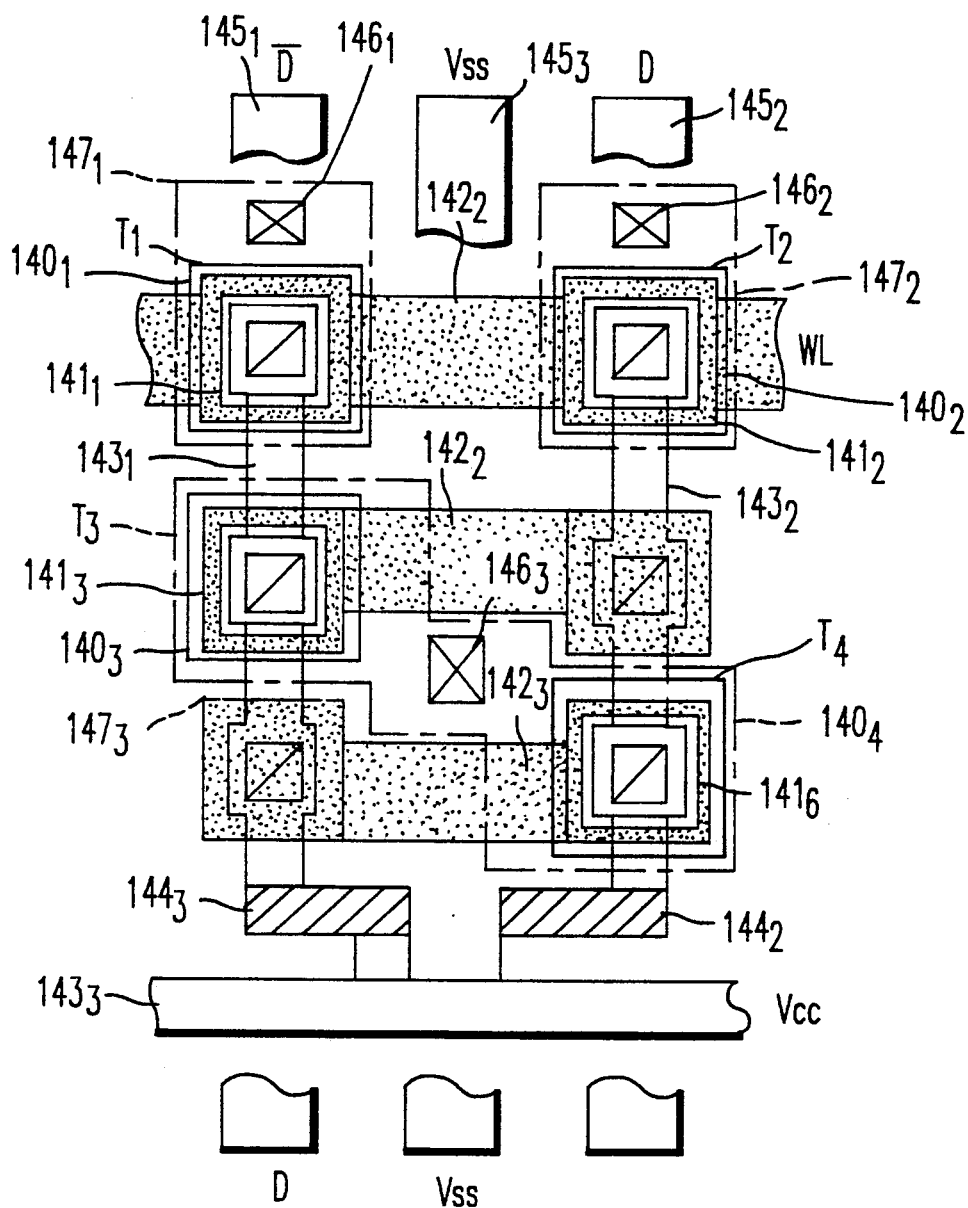
FIG. 52 is a plan view illustrating a twentieth embodiment according to the present invention.
Figure 53:
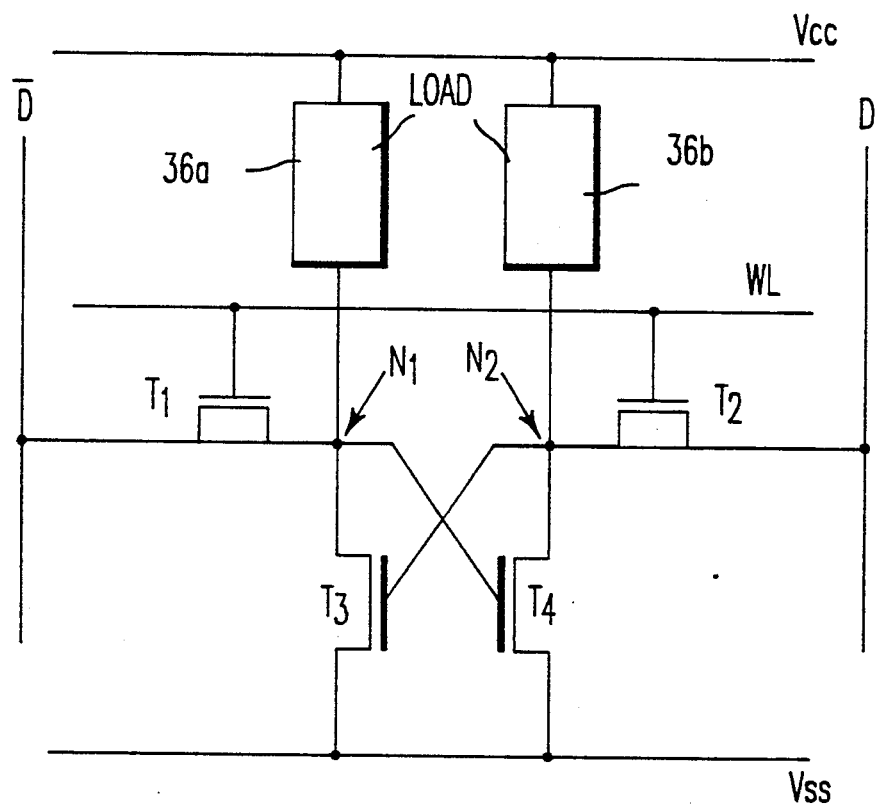
FIG. 53 is a diagram illustrating an equivalent circuit of FIG. 52.

FIG. 52 is a plan view illustrating an SRAM of this invention, and FIG. 53 shows an equivalent circuit thereof. In FIG. 52, pillar silicon layers 141 ($141_1$, $141_2$, ---) are formed in the trenches 140 ($140_1$, $140_2$, ---) provided on the silicon substrate. MOS transistors $T_1$ and $T_2$, which serve transfer gates, are respectively formed using pillar layers $141_1$ and $141_2$. The structures of the transistors $T_1$ and $T_2$ are basically the same as those of the MOS transistors in the nineteenth embodiment. Specifically, drain diffusion layers are formed on the upper surfaces of the pillar layers 141. Buried source diffusion layers are formed at the bottom of the trenches 140. A gate electrode $142_1$ of the polysilicon film is formed continuously so as to surround the pillar layers $141_1$ and $141_2$. The gate electrode $142_1$ constitutes a word line WL with respect to the MOS transistors $T_1$ and $T_2$. A driver MOS transistor $T_3$ is constituted by the pillar layer $141_3$. Another driver MOS transistor $T_4$ is constituted by the pillar layer $141_6$. The MOS transistors $T_3$ and $T_4$ have substantially the same structures as those in the nineteenth embodiment. The gate electrode $142_3$ of the MOS transistor $T_3$ extends under a data wiring $145_2$. At a portion on this pillar layer, a polysilicon film lead $143_2$ is connected to the gate electrode $142_2$. The drain layers of the MOS transistors $T_2$ and $T_4$ are connected to each other by way of the lead $143_2$.

The drain regions of the MOS transistors $T_1$ and $T_3$ are connected to each other by way of the lead $143_1$. The leads $143_1$ and $143_2$ are connected to a power supply (Vcc) lead $143_3$ respectively interposing high-resistance polysilicon films $144_1$ and $144_2$ (load resistors), as shown in FIG. 52. In FIG. 52, a data lead D $145_1$, a data lead D $145_2$ and a ground (Vss) lead $145_3$ are shown with their intermediate portions omitted. These leads $145_1$, $145_2$ and $145_3$ are all made of Al film. The leads $145_1$ and $145_2$ are respectively connected to the source diffusion layers of the MOS transistors $T_1$ and $T_2$ at contact portions $146_1$ and $146_2$ through the drawing diffusion layer formed deeply. The ground lead $145_3$ is connected to the common source diffusion layers of the MOS transistors $T_3$ and $T_4$ at a contact portion $146_3$. In FIG. 52, a region 147, which are respectively encircled by dot-and-dash lines, represent the element regions.

Figure 54:
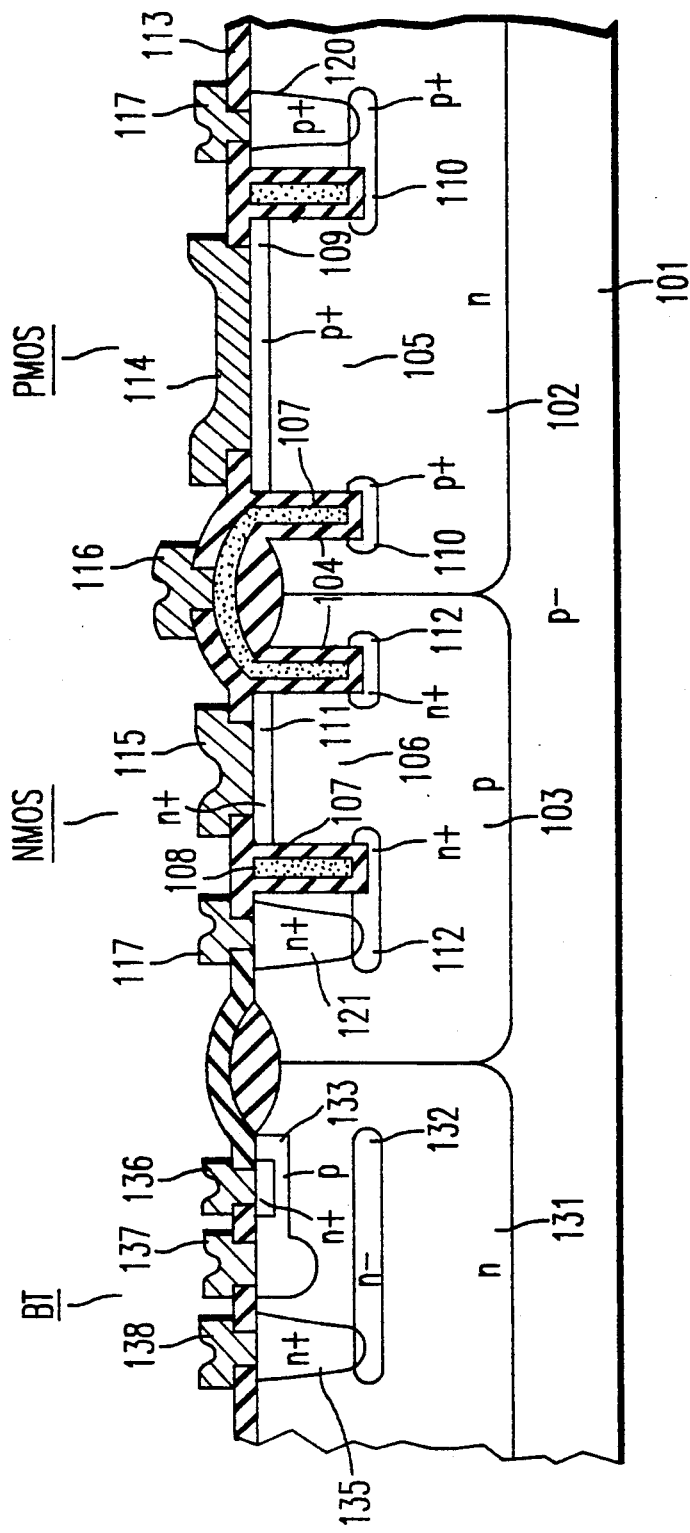
FIG. 54 is a cross-sectional view illustrating a twenty first embodiment according to the present invention.

FIG. 54 is a sectional view illustrating a BiCMOS of a twenty first embodiment of this invention. In FIG. 54, a CMOS inverter gate section comprising a p-channel MOS transistor and n-channel MOS transistor and a npn transistor BT. The npn transistor BT is formed in the n-type well 131, and having an n+ collector buried layer 132, a p-type base layer 133 and a n+ emmitter layer 134. The collector buried layer 132 is drawn using the n+ drawing diffusion layer 135, and a collector electrode 138 is contacted at this position. A base electrode 137 is formed on the p-type base layer. An emitter electrode 136 is formed on the emitter layer.

The vertical MOS transistor of this invention has a structure using the buried diffusion layer and the diffusion layer to draw the buried diffusion layer on the surface of the substrate. Therefore, the process is common the bipopar transistor manufacturing process. In FIG. 54, the n-type well 131 for forming the npn transistor BT can be simultaneously formed the n-type well 102 for forming the p-type channel MOS transistor pMOS. The collector buried layer 132 can be simultaneously formed the buried drain diffusion layer 112 of the n-type channel MOS transistor nMOS. The collector drawing diffusion layer 135 can be simultaneously formed the drawing diffusion layer 121 of the drain diffusion layer 112. The emitter layer 134 can be simultaneously formed the source diffusion layer 111 of the n-type channel MOS transistor.

Obviously, numerous additional modifications and variations of the present invention are possible in light of the above teachings. It is therefore to be understood that within the scope of the appended claims, the invention may be practiced otherwise than as specifically described herein.

What is claimed is:

1. A MOS-type semiconductor integrated circuit device, comprising:
   a semiconductor substrate having a first well region of a first conductivity type therein and a second well region of a second conductivity type in the substrate adjoining said first well region defining an interface end therebetween;
   a first pillar layer on the first well region, including an upper surface and an outer wall surface;
   a second pillar layer on the second well region, including a top surface and an outer side surface;

a trench having a bottom, for entirely surrounding each of said first and second pillar layers, the bottom of said trench being exposed to the interface end of said first and second well regions;

a first source region of the second conductivity-type on the upper surface of said first pillar layer;

a first drain region of the second conductivity type on the first well region adjoining said first pillar layer;

a first gate insulating film on the outer wall surface of said first pillar layer for entirely surrounding the first pillar layer;

a second source region of the first conductivity type on the top surface of said second pillar layer;

a second drain region of the first conductivity type on the second well region adjoining said second pillar layer;

a second gate insulating film on the outer side surface of said second pillar layer for surrounding the second pillar layer;

first and second gate conductive films on both the first and second insulating films;

a gate connection conductive film for connecting both the first and second gate conductive films in said trench;

an insulating layer on the substrate, having openings therein for exposing a part of each of the first and second source regions, said first and second drain regions and said gate connection conductive film;

an input electrode on said insulating layer for electrical connection to the exposed part of said gate connection conductive film through one of the openings in said insulating layer;

a pair of power supply electrodes on said insulating layer, each for connection to a respective one of said first and second source regions through the respective openings in said insulating layer; and an output electrode on said insulating layer for connection in common to the first and second drain regions.

2. The device of claim 1, wherein said semiconductor substrate includes silicon and both the gate conductive film and the gate connection conductive film include polysilicon.

3. The device of claim 1, wherein said first conductivity type is p-type and said second conductivity type is n-type.

4. The device of claim 3, wherein said first pillar layer has an outer circumferential area smaller than that of said second pillar layer.

5. The device of claim 1, further comprising:
an elongated resistor film having one end thereof connected to the second drain region, and the other end thereof exposed to one of the openings in said insulating layer; and
an electrode on the surface of said insulating layer for connection to the resistor film through one of the openings.

6. The device of claim 5, wherein said resistor film includes polysilicon.

7. A MOS-type semiconductor integrated circuit device, comprising:
a semiconductor substrate having a plurality of pillar layers of a first conductivity type on the substrate, each having an outer wall surface and an upper surface;
a gate insulating film on the outer wall surface of each pillar layer for entirely surrounding the pillar layer;
a first region of a second conductivity type on the upper surface of each pillar layer;
a second region of the second conductivity type on the substrate adjoining each pillar layer, said second regions being connected to each other;
a gate conductive film on each gate insulating film for entirely surrounding the outer wall surface of each pillar layer, the gate conductive film embedded in trenches interposed between said pillar layers and connected to each other;
a first electrode connected in common to the first regions;
a second electrode connected to the second regions; and
a gate electrode connected to the gate conductive film.

8. The device of claim 7, further comprising:
an insulating layer on the substrate, having openings therein for exposing a part of each of said first regions, second regions and gate conductive films; and
a plurality of electrodes on the insulating layer each for connection to corresponding ones of the first and second regions and the gate conductive film.

9. A MOS-type semiconductor integrated circuit device, comprising:
a semiconductor substrate having a semiconductor region of a first conductivity type therein and a well region of a second conductivity type in the substrate adjoining said semiconductor region defining an interface end therebetween;
a first pillar layer on the semiconductor region, including an upper surface and an outer wall surface;
a second pillar layer on the well region, including a top surface and an outer side surface;
a trench having a bottom, for entirely surrounding each of said first and second pillar layers, the bottom of said trench being exposed to the interface end of said semiconductor and well regions;
a first source region of the second conductivity type on the upper surface of said first pillar layer;
a first drain region of the second conductivity type on the semiconductor region adjoining said first pillar layer;
a first gate insulating film on the outer wall surface of said first pillar layer for entirely surrounding said first pillar layer;
a second source region of the first conductivity type on the top surface of said second pillar layer;
a second drain region of the first conductivity type on the well region adjoining said second pillar layer;
a second gate insulating film on the outer side surface of said second pillar layer for surrounding the second pillar layer;
first and second gate conductive films on both the first and second insulating films;
a gate connection conductive film for connecting both the first and second gate conductive films in said trench;
an insulating layer on the substrate, having openings therein for exposing a part of each of the first and second source regions, said first and second drain regions and said gate connection conductive film;
an input electrode on said insulating layer for electrical connection to the exposed part of said gate connection conductive film through one of the openings in said insulating layer;

a pair of power supply electrodes on said insulating layers, for connection to one of the source regions and the drain regions through the respective openings in said insulating layer; and an output electrode on said insulating layer for connection to the other of the source regions and drain regions.

10. The device of claim 9, wherein said semiconductor substrate includes silicon and both the gate conductive films and the gate connection conductive film include polysilicon.

11. The device of claim 9, wherein said first conductivity type is p-type and said second conductivity type is n-type.

12. The device of claim 11, wherein said first pillar layer has an outer circumferential area smaller than that of said second pillar layer.

13. The device of claim 9, further comprising:

an elongated resistor film having one end thereof connected to the second region, and the other end thereof exposed to one of the openings in said insulating layer; and an electrode on the surface of said insulating layer for connection to the resistor film through one of the openings.

14. The device of claim 13, wherein said resistor film includes polysilicon.

* * * * *

UNITED STATES PATENT AND TRADEMARK OFFICE
CERTIFICATE OF CORRECTION

PATENT NO. : 5,258,635
DATED : November 2, 1993
INVENTOR(S) : Akihiro Nitayama et al.

It is certified that error appears in the above-indentified patent and that said Letters Patent is hereby corrected as shown below:

On the title page, Item [30] and [63],

[30], please insert, --Nov. 1, 1989 [JP] Japan.......1-282876--

[63], should read: --Continuation of Ser. No. 448,153, Dec. 8, 1989, abandoned, which is a continuation-in-part of Ser. No. 403,299, Sep. 5, 1989, abandoned--

Signed and Sealed this

Nineteenth Day of July, 1994

Attest:

BRUCE LEHMAN

*Attesting Officer*     *Commissioner of Patents and Trademarks*